US009590034B2

United States Patent
Shin et al.

(10) Patent No.: US 9,590,034 B2
(45) Date of Patent: Mar. 7, 2017

(54) METHODS OF FORMING SEMICONDUCTOR DEVICES TO INCLUDE SINGLE BODY INTERCONNECTION PATTERNS USING FINE PATTERNING TECHNIQUES, AND SEMICONDUCTOR DEVICE SO FORMED

(71) Applicants: Seok-ho Shin, Seoul (KR); Chul Lee, Seoul (KR)

(72) Inventors: Seok-ho Shin, Seoul (KR); Chul Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/682,132

(22) Filed: Apr. 9, 2015

(65) Prior Publication Data

US 2015/0371685 A1    Dec. 24, 2015

(30) Foreign Application Priority Data

Jun. 23, 2014    (KR) .................. 10-2014-0076515

(51) Int. Cl.
*H01L 29/06*    (2006.01)
*H01L 27/02*    (2006.01)
(Continued)

(52) U.S. Cl.
CPC .... *H01L 29/0649* (2013.01); *H01L 21/76816* (2013.01); *H01L 21/76895* (2013.01);
(Continued)

(58) Field of Classification Search
CPC ........... H01L 27/0207; H01L 27/10814; H01L 27/10885; H01L 27/10894; H01L 29/0649
See application file for complete search history.

(56) References Cited

U.S. PATENT DOCUMENTS 5,177,575 A * 1/1993 Ikeda .................. G11C 7/18
257/296
5,798,544 A * 8/1998 Ohya ................ H01L 27/10823
257/296
(Continued)

FOREIGN PATENT DOCUMENTS

JP       2004-274063    9/2004
KR       10-0454131    10/2004
(Continued)

*Primary Examiner* — Charles Garber
*Assistant Examiner* — Brigitte Paterson
(74) *Attorney, Agent, or Firm* — Ward and Smith, P.A.

(57) ABSTRACT

A method of forming fine patterns for a semiconductor device includes providing a substrate with a first region and a second region, forming a conductive layer on the substrate, the conductive layer including a plate portion covering the first region and first protruding portions extending from the plate portion in a first direction and covering a portion of the second region, forming first mask patterns on the conductive layer, the first mask patterns extending in the first direction and being spaced apart from each other in a second direction crossing the first direction, forming a second mask pattern on the second region to cover the first protruding portions, and patterning the conductive layer using the first and second mask patterns as an etch mask to form conductive patterns. In plan view, each of the first protruding portions is overlapped with a corresponding one of the first mask patterns.

20 Claims, 38 Drawing Sheets

(51) Int. Cl.
*H01L 27/108* (2006.01)
*H01L 21/768* (2006.01)

(52) U.S. Cl.
CPC .... *H01L 27/0207* (2013.01); *H01L 27/10814* (2013.01); *H01L 27/10885* (2013.01); *H01L 27/10894* (2013.01)

(56) References Cited

U.S. PATENT DOCUMENTS

| | | |
|---|---|---|
| 6,660,581 B1 | 12/2003 | Yang et al. |
| 8,216,947 B2 | 7/2012 | Lee et al. |
| 8,742,529 B2 | 6/2014 | Sugimae et al. |
| 2003/0227063 A1 | 12/2003 | Sel et al. |
| 2008/0012055 A1 | 1/2008 | Kim et al. |
| 2010/0301449 A1 | 12/2010 | Scheuerlein et al. |
| 2013/0105937 A1 | 5/2013 | Niroomand et al. |
| 2013/0119462 A1 | 5/2013 | Kye et al. |

FOREIGN PATENT DOCUMENTS

| | | |
|---|---|---|
| KR | 10-2010-0037406 A | 4/2010 |
| KR | 10-2011-0001786 A | 1/2011 |
| KR | 10-2013-0053278 A | 5/2013 |

\* cited by examiner

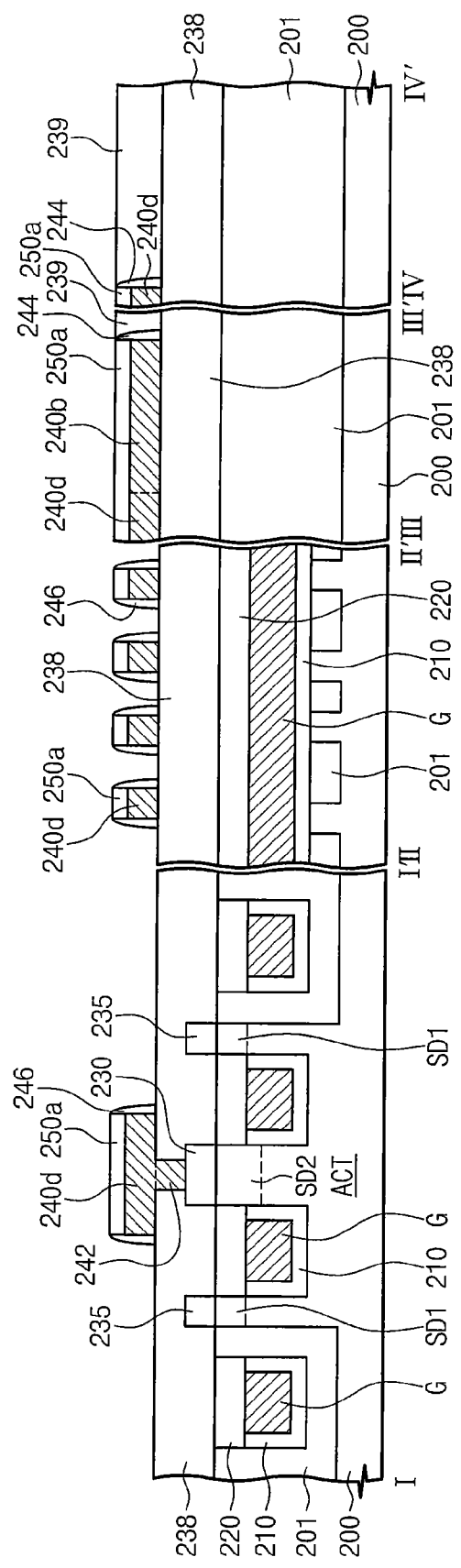

METHODS OF FORMING SEMICONDUCTOR DEVICES TO INCLUDE SINGLE BODY INTERCONNECTION PATTERNS USING FINE PATTERNING TECHNIQUES, AND SEMICONDUCTOR DEVICE SO FORMED

CROSS-REFERENCE TO RELATED APPLICATIONS

This U.S. non-provisional patent application claims priority under 35 U.S.C. §119 to Korean Patent Application No. 10-2014-0076515, filed on Jun. 23, 2014, in the Korean Intellectual Property Office, the entire contents of which are hereby incorporated herein by reference.

BACKGROUND

Embodiments of the inventive concept relate to a semiconductor device and a fine patterning method for semiconductor devices, and in particular, to a method of forming fine interconnection patterns that include a contact pad, a method of fabricating a semiconductor device using the same, and a semiconductor device fabricated thereby.

In order to realize a highly-integrated semiconductor device, methods of forming fine patterns may be used. For example, to form more devices per a given area, the size of each pattern should be as small as possible. In other words, a pattern should be formed in such a way that the pitch of the pattern or a sum of a width of each element of the pattern and a space between adjacent elements of the pattern is reduced. However, such approaches may be limited when the resolution of the applicable photolithography process is stretched to the limit. For example, in the case where interconnection lines are formed using a double pattern technology DPT process, there may be technical difficulties in obtaining sufficient contact area between contact plugs used as connection nodes between an external circuit and interconnection lines. For example, a cell bit-line (BL) can be connected to a direct contact (DC), which may serve as a connection node to a sense amplifier (S/A), but may have insufficient contact area. This may lead to an increase in electric resistance of the interconnection line.

SUMMARY

According to some embodiments of the inventive concept, a method of forming fine patterns for a semiconductor device may include providing a substrate with a first region and a second region, forming a conductive layer on the substrate, the conductive layer including a plate portion covering the first region and a plurality of first protruding portions extending from the plate portion in a first direction parallel to a top surface of the substrate and covering a portion of the second region, forming first mask patterns on the conductive layer, the first mask patterns extending parallel to the first direction and spaced apart from each other in a second direction that crosses the first direction, forming a second mask pattern on the second region of the substrate to cover the first protruding portions, and patterning the conductive layer using the first and second mask patterns as an etch mask to form conductive patterns. When viewed in plan view, each of the first protruding portions may be overlapped by a corresponding one of the first mask patterns.

In some embodiments, the first protruding portions on the second region may be formed spaced apart from each other in the second direction.

In some embodiments, the second region may be a region of the substrate that surrounds the first region, and the conductive layer may further include a plurality of second protruding portions extending from the plate portion toward a direction opposite to the first direction to cover another portion of the second region.

In some embodiments, the second protruding portions on the second region may be spaced apart from each other in the second direction.

In some embodiments, when viewed in the plan view, each of the first and second protruding portions may be overlapped by a corresponding one of the first mask patterns.

In some embodiments, the second mask pattern may be formed to cover the second protruding portions.

In some embodiments, the conductive patterns may include first and second line patterns formed by etching the plate portion using the first mask patterns as an etch mask, the first and second line patterns extending along the first direction and being spaced apart from each other in the second direction, and the first and second protruding portions connected to the first and second line patterns, respectively.

In some embodiments, when measured along the second direction, each of the line patterns may have a first width, and each of the first and second protruding portions may have a second width that is greater than the first width.

In some embodiments, the forming of the conductive layer may include forming a preliminary conductive layer on the substrate to cover the first region and the second region, and pattering the preliminary conductive layer to form recess regions defining the first protruding portions on the second region.

In some embodiments, the forming of the first mask patterns may include forming sacrificial patterns defining openings that extend along the first direction to expose the conductive layer, forming a mask layer on the conductive layer to cover the sacrificial patterns, anisotropically etching the mask layer to expose top surfaces of the sacrificial patterns and to expose the conductive layer between the sacrificial patterns, and removing the sacrificial patterns.

In some embodiments, when viewed in the plan view, the second mask pattern may be formed to be spaced apart from the plate portion.

In some embodiments, when measured along the second direction, each of the first mask patterns may have a first width, and each of the first protruding portions may have a second width that is greater than the first width.

According to some embodiments of the inventive concept, a method of fabricating a semiconductor device may include providing a substrate including a cell region and a peripheral circuit region, forming word lines on the cell region of the substrate, the word lines extending parallel to a first direction and being spaced apart from each other in a second direction that crosses the first direction, forming a conductive layer on the substrate, the conductive layer including a plate portion covering the cell region and a plurality of first protruding portions extending from the plate portion in the second direction and covering a portion of the peripheral circuit region, forming cell mask patterns on the conductive layer, the cell mask patterns extending parallel to the second direction and spaced apart from each other in the first direction, forming a peripheral mask pattern on the peripheral circuit region of the substrate to cover the first protruding portions, and patterning the conductive layer using the cell and peripheral mask patterns as an etch mask to form interconnection patterns. When viewed in plan view, each of the first protruding portions may be overlapped by a corresponding one of the cell mask patterns.

In some embodiments, the conductive layer further may include a plurality of second protruding portions extending from the plate portion toward a direction opposite to the second direction to cover another portion of the peripheral circuit region.

In some embodiments, the first protruding portions may be formed to be spaced apart from each other in the first direction on the peripheral circuit region, and the second protruding portions may be spaced apart from each other in the first direction on the peripheral circuit region.

In some embodiments, when viewed in the plan view, each of the first and second protruding portions may be overlapped by a corresponding one of the cell mask patterns.

In some embodiments, the peripheral mask pattern may be formed to cover the second protruding portions.

In some embodiments, the interconnection patterns may include bit lines formed by etching the plate portion using the cell mask patterns as an etch mask, the bit lines extending along the second direction and being spaced apart from each other in the first direction, and the first and second protruding portions connected to the bit lines, respectively. The first and second protruding portions serve as contact pads, on which contacts for applying voltages to the bit lines will be provided.

In some embodiments, when measured along the first direction, each of the bit lines may have a first width, and each of the first and second protruding portions may have a second width that is greater than the first width.

According to some embodiments of the inventive concept, a method of forming fine patterns for a semiconductor device may include forming a mold layer on a substrate including a first region and a second region, forming a first sacrificial layer on the mold layer, forming insulating patterns in the first sacrificial layer of the second region, the insulating patterns being spaced apart from each other in a first direction, forming second sacrificial patterns on the first sacrificial layer, the second sacrificial patterns defining gap regions spaced apart from each other in the first direction and extending parallel to a second direction that crosses the first direction, forming a mask pattern on the first sacrificial layer of the second region to cover the insulating patterns, and etching the first sacrificial layer using the second sacrificial patterns and the mask pattern as an etch mask. When viewed in plan view, at least a portion of each of the insulating patterns may be overlapped by a corresponding one of the gap regions.

According to some embodiments of the inventive concept, a semiconductor device may include a line pattern on a substrate extending in a first direction, a contact pad connected to an end portion of the line pattern to form a single body with the line pattern, a first spacer extending along a side surface of the contact pad, and a second spacer extending along both side surfaces of the line pattern. The first and second spacers may be in contact with each other to form a boundary.

In some embodiments, the line pattern may have a first width in a second direction crossing the first direction, the contact pad may have a second width in the second direction, and the second width is greater than the first width.

In some embodiments, the second spacer extends along a second direction that crosses the first direction and may be in contact with at least one portion of the side surface of the contact pad.

In some embodiments, when viewed in plan view, the contact pad may have a pointed portion at a region where the first and second spacers may be in contact with each other.

In some embodiments, the device may further include a contact in contact with the contact pad. The contact may have a bottom surface that may be positioned at a higher level than a bottom surface of the contact pad.

In some embodiments, the device may further include a word line on the substrate extending along a second direction that crosses the first direction. The line pattern that can be a bit line.

In some embodiments, the device may further include a device isolation layer defining active regions in the substrate. When viewed in the plan view, each of the active regions may be bar shaped extending along a third direction crossing the first and second directions and is parallel to the substrate, and the word line and the line pattern may be electrically connected to one of the active regions.

In some embodiments, the line pattern may include a plurality of line patterns that may be arranged along a second direction that crosses the first direction, and the contact pad includes a plurality of first contact pads connected to odd-numbered ones of the line patterns, respectively, and a plurality of second contact pads connected to even-numbered ones of the line patterns, respectively. When viewed in the plan view, the first contact pads and the second contact pads may be face each other with the line patterns interposed therebetween.

In some embodiments, the first spacer may be in contact with the side surface of the contact pad, and the second spacer may be in contact with the side surfaces of the line pattern.

In some embodiments, the device may further include a third spacer provided on a side surface of an end portion of the line pattern that is opposite to the contact pad. The third spacer may include the same material as the first spacer.

In some embodiments, a semiconductor device can include a unitary interconnection pattern that can include a linear portion in a cell region of a substrate that extends in a first direction to a peripheral region of the substrate and include a contact portion in the peripheral region. A first spacer can be on side walls of the linear portion and a second spacer, that is separate from the first spacer, can be on a side wall of the contact portion.

In some embodiments, the first spacer can be on a portion of the side wall of the contact portion that faces the cell region and can be absent from other side walls of the contact portion. In some embodiments, the second spacer can be absent from the side wall of the contact portion that faces the cell region. In some embodiments, the contact portion can be wider in a second direction that crosses the first direction than the linear portion.

In some embodiments, the linear portion and the contact portion can be commonly formed to provide the unitary interconnection pattern. In some embodiments, the first and second spacers can meet at a boundary that can be aligned to the side wall of the contact portion that faces the cell region. In some embodiments, the unitary interconnection pattern can be a first unitary interconnection pattern, where the semiconductor device can further include a second unitary interconnection pattern that can include a linear portion in the cell region that extends opposite the first direction to the peripheral region and can include a contact portion in the peripheral region that can be opposite the contact portion of the first unitary interconnection pattern.

In some embodiments, the semiconductor device can further include a third spacer on side walls of the linear portion of the second unitary interconnection pattern and a fourth spacer on the second unitary interconnection pattern, that can be separate from the third spacer on the second unitary interconnection pattern, where the fourth spacer on the second unitary interconnection pattern can be on a side wall of the contact portion of the second unitary interconnection pattern.

In some embodiments, the linear portion can cross from the cell region into the peripheral region. In some embodiments, the unitary interconnection pattern can transition from the linear portion to the contact portion in the peripheral region.

BRIEF DESCRIPTION OF THE DRAWINGS

Some embodiments will be more clearly understood from the following brief description taken in conjunction with the accompanying drawings. The accompanying drawings represent non-limiting, some embodiments as described herein.

FIGS. 1A through 5A are plan views illustrating a fine patterning method for forming semiconductor devices, according to some embodiments of the inventive concept.

FIGS. 1B through 5B are diagrams illustrating vertical sections taken along lines I-I', II-II', and III-III' of FIGS. 1A through 5A, respectively.

FIGS. 6A through 10A are plan views illustrating a method of fabricating a semiconductor devices, using the fine patterning method according to some embodiments of the inventive concept.

FIGS. 7B through 10B are diagrams illustrating vertical sections taken along lines I-I', II-II', III-III', and IV-IV' of FIGS. 7A through 10A, respectively.

FIGS. 11A through 16A are plan views illustrating a fine patterning method for forming semiconductor devices according to some embodiments of the inventive concept.

FIGS. 11B through 16B are diagrams illustrating vertical sections taken along lines I-I', II-II', and III-III' of FIGS. 11A through 16A, respectively.

Figure 1A:
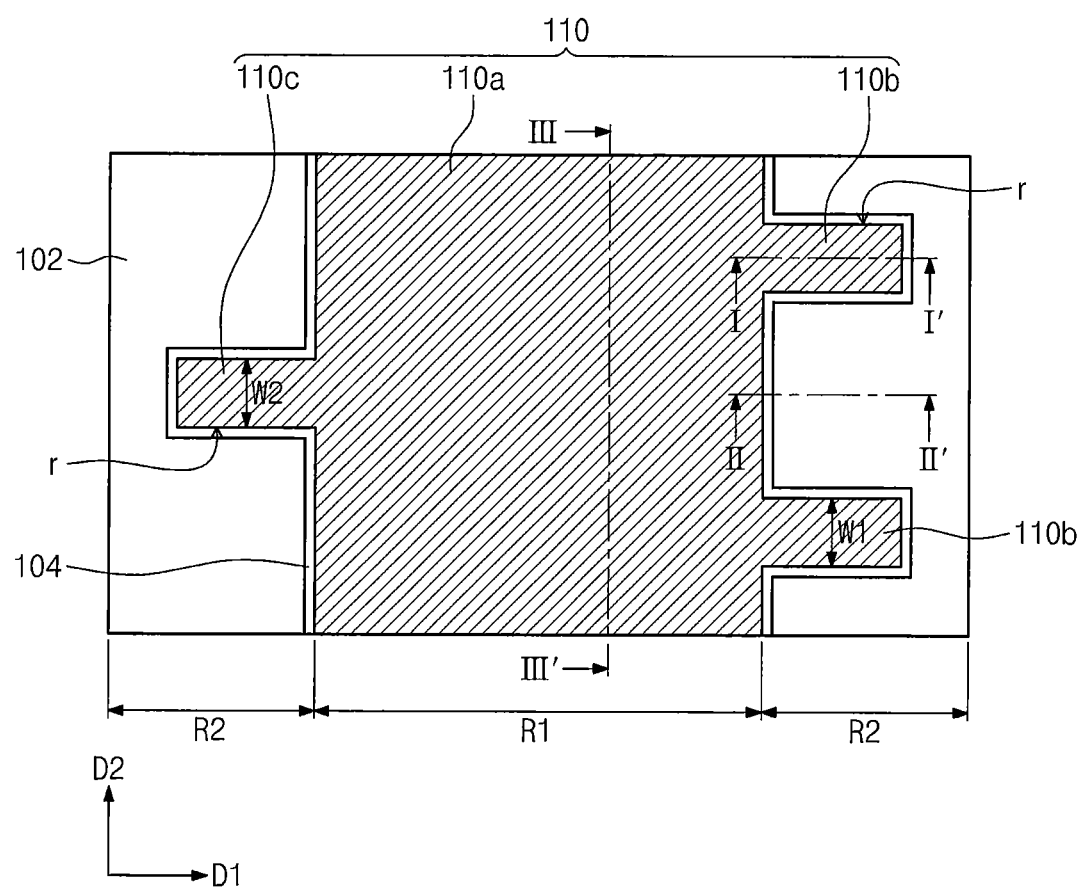

It should be noted that these figures are intended to illustrate the general characteristics of methods, structure and/or materials utilized in some embodiments and to supplement the written description provided below. These drawings are not, however, to scale and may not precisely reflect the precise structural or performance characteristics of any given embodiment, and should not be interpreted as defining or limiting the range of values or properties encompassed by some embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Embodiments of the inventive concepts will now be described more fully with reference to the accompanying drawings, in which some embodiments are shown. Some embodiments of the inventive concepts may, however, be embodied in many different forms and should not be construed as being limited to the embodiments set forth herein; rather, these embodiments are provided so that this disclosure will be thorough and complete, and will fully convey the concept of some embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of some embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of some embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Some embodiments of the inventive concepts are described herein with reference to cross-sectional illustrations that are schematic illustrations of idealized embodiments (and intermediate structures) of some embodiments. As such, variations from the shapes of the illustrations as a result, for example, of manufacturing techniques and/or tolerances, are to be expected. Thus, some embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of some embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which some embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1A through 5A are plan views illustrating a fine patterning method for forming semiconductor devices, according to some embodiments of the inventive concept. FIGS. 1B through 5B are diagrams illustrating vertical sections taken along lines I-I', II-II', and III-III' of FIGS. 1A through 5A, respectively, and FIG. 5C is an enlarged sectional view illustrating a portion P of FIG. 5A.

Figure 1B:
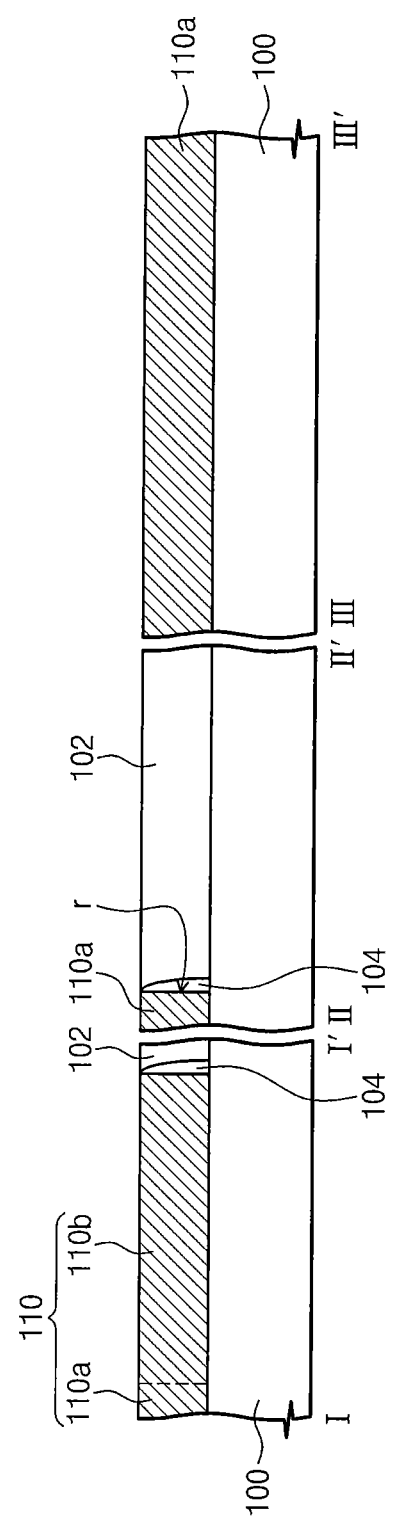

Referring to FIGS. 1A and 1B, a lower structure 100 with a first region R1 and a second region R2 may be provided. The first region R1 may be a region of the lower structure 100, and the second region R2 may be another region of the lower structure 100 provided around or adjacent to the first region R1. The lower structure 100 may include a semiconductor substrate (e.g., a silicon, germanium, or silicon-germanium wafer) and an insulating layer provided thereon.

A conductive layer 110 may be formed on the lower structure 100. The conductive layer 110 may include a plate portion 110a and a plurality of protruding portions. The plate portion 110a may cover the first region R1 of the lower structure 100, and each of the protruding portions may extend from the plate portion 110a in a direction parallel to a top surface of the lower structure 100 and may cover a respective portion of the second region R2 of the lower structure 100. The plurality of protruding portions may include first protruding portions 110b, which extend from the plate portion 110a in a first direction D1 and cover a portion of the second region R2 of the lower structure 100, and second protruding portions 110c, which extend from the plate portion 110a in a direction that is opposite to the first direction D1 and cover another portion of the second region R2 of the lower structure 100.

The first protruding portions 110b on the second region R2 may be spaced apart to one another along a second direction D2 that crosses the first direction D1. The plate portion 110a may have a side surface exposed between each directly adjacent pair of the first protruding portions 110b. In other words, the conductive layer 110 may have an uneven side surface extending in the direction D2 defined by the first protruding portions 110b. Similarly, the second protruding portions 110c on the second region R2 may be spread apart along the second direction D2. The plate portion 110a may also have an opposite side surface that is exposed between each directly adjacent pair of the second protruding portions 110c. In other words, the conductive layer 110 may also have an uneven opposite side surface extending in the direction D2 defined by the second protruding portions 110c. Here, the plate portion 110a may be provided in such a way that the two side surfaces thereof face each other, and the conductive layer 110 may be provided in such a way that the two side surfaces thereof face each other. The first and second protruding portions 110b and 110c may be provided in such a way that the conductive layer 110 does not have mirror symmetry with respect to a line parallel to the second direction. In other words, the first and second protruding portions 110b and 110c may be staggered relative to each other along the direction D2.

When measured in the second direction D2, each of the first protruding portions 110b may have a first width W1, and each of the second protruding portions 110c may have a second width W2. In some embodiments, the first and second widths W1 and W2 may be substantially the same.

The formation of the conductive layer 110 may include forming a preliminary conductive layer on the lower structure 100 to cover the first and second regions R1 and R2, and then, patterning the preliminary conductive layer to form recess regions r defining the first and second protruding portions 110b and 110c on the second region R2. The conductive layer 110 may be formed of or include at least one of, for example, doped semiconductor materials (e.g., doped silicon, doped germanium, and so forth), conductive metal nitrides (e.g., titanium nitride, tantalum nitride, and so forth), metals (e.g., tungsten, titanium, tantalum, and so forth), and metal-semiconductor compounds (e.g., tungsten silicide, cobalt silicide, titanium silicide, and so forth).

A first spacer 104 may be formed on the side surfaces of the conductive layer 110. The first spacer 104 may be formed of or include a silicon oxide layer, a silicon nitride layer, a silicon oxynitride layer or other materials. The formation of the first spacer 104 may include forming a first spacer layer on the lower structure 100 to cover the conductive layer 110 and anisotropically etching the first spacer layer. The anisotropic etching process may be performed to expose a top surface of the conductive layer 110 and the top surface of the lower structure 100.

An interlayered insulating layer 102 may be formed on the lower structure 100 to surround the conductive layer 110. The interlayered insulating layer 102 may be formed of or include, for example, oxide. The first spacer 104 may be interposed between the interlayered insulating layer 102 and the conductive layer 110 (for example, between side surfaces thereof). The formation of the interlayered insulating layer 102 may include forming an insulating layer on the lower structure 100 to cover the conductive layer 110 and planarizing the insulating layer to expose the top surface of the conductive layer 110.

Figure 2A:
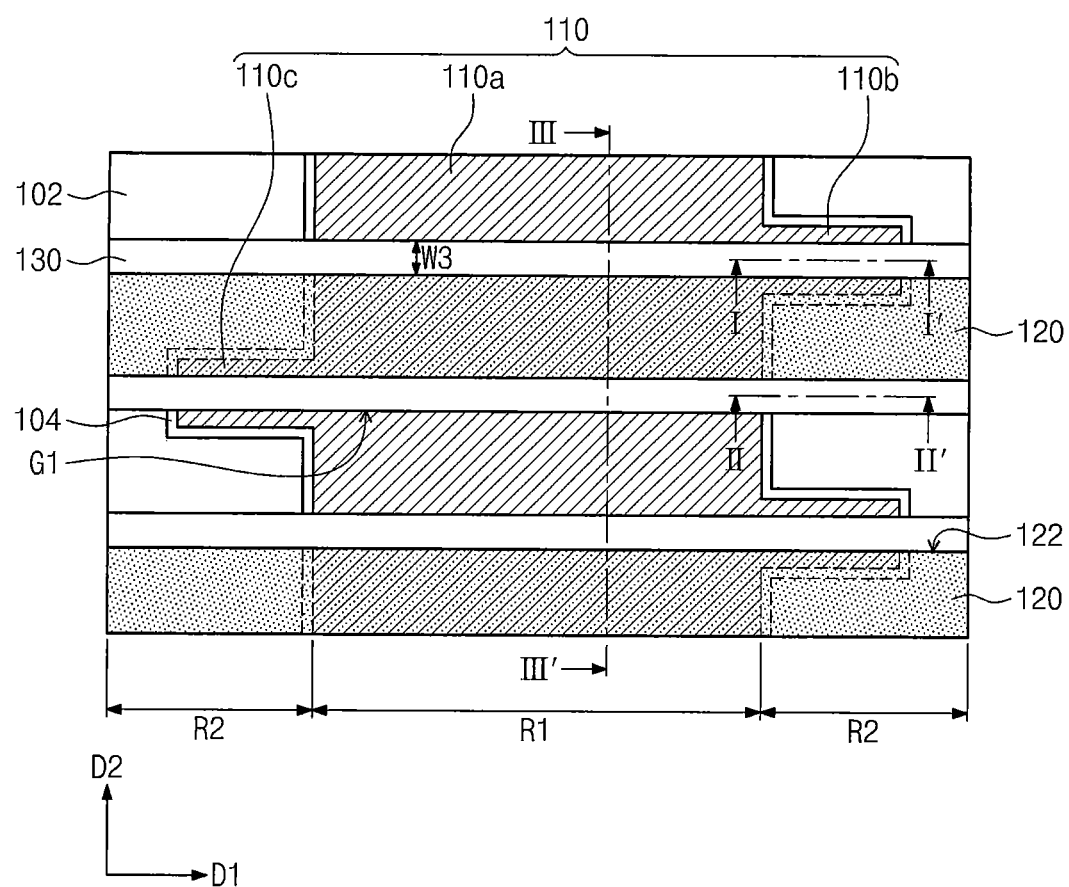
Figure 2B:
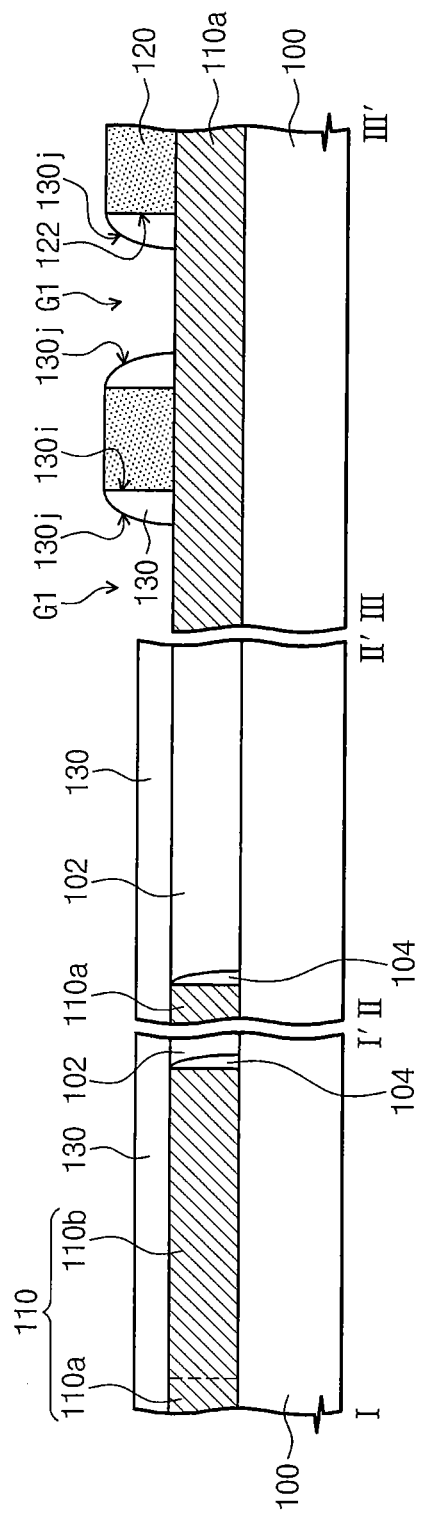

Referring to FIGS. 2A and 2B, sacrificial patterns 120 may be formed on the conductive layer 110 to have openings 122, which are formed parallel to the first direction D1 to expose the conductive layer 110. Each of the sacrificial patterns 120 may extend in the first direction D1 and may be separated from each other in the second direction D2. The sacrificial patterns 120 may be formed of or include a spin-on-hardmask (SOH) layer.

Thereafter, first mask patterns 130 may be formed on inner side surfaces of the openings 122. The first mask patterns 130 may be formed to define first gap regions G1, each of which exposes a portion of the conductive layer 110 in the openings 122. Each of the first mask patterns 130 may include a first side surface 130i in contact with the sacrificial patterns 120 and a second side surface 130j opposite to the first side surface 130i. Each of the first gap regions G1 may be delimited by the second side surfaces 130j of a directly adjacent pair of the first mask patterns 130 and the top surface of the conductive layer 110 exposed in the opening 122. The first mask patterns 130 may be formed parallel to the first direction D1 and may be spaced apart from each other in the second direction D2.

When viewed in plan view, each of the first mask patterns 130 may be formed in such a way to overlap a corresponding one of the protruding portions 110b and 110c. In some embodiments, odd-numbered ones of the first mask patterns 130 may overlap with the first protruding portions 110b, respectively, and even-numbered ones of the first mask patterns 130 may overlap with the second protruding portions 110c, respectively.

When measured in the second direction D2, each of the first mask patterns 130 may have a third width W3. In some embodiments, the third width W3 may be less than the first and second widths W1 and W2. In some embodiments, the first mask patterns 130 may be formed of or include oxide or other materials.

The formation of the first mask patterns 130 may include forming a mask layer on the conductive layer 110 to cover the sacrificial patterns 120, and anisotropically etching the mask layer to expose the sacrificial patterns 120 and the conductive layer 110 between the sacrificial patterns 120. The mask layer may be formed of or include a silicon oxide layer or other materials. As a result of the anisotropic etching process, the first mask patterns 130 may be locally formed on both side surfaces of each of the sacrificial patterns 120 to have a spacer-shaped structure.

Figure 3A:
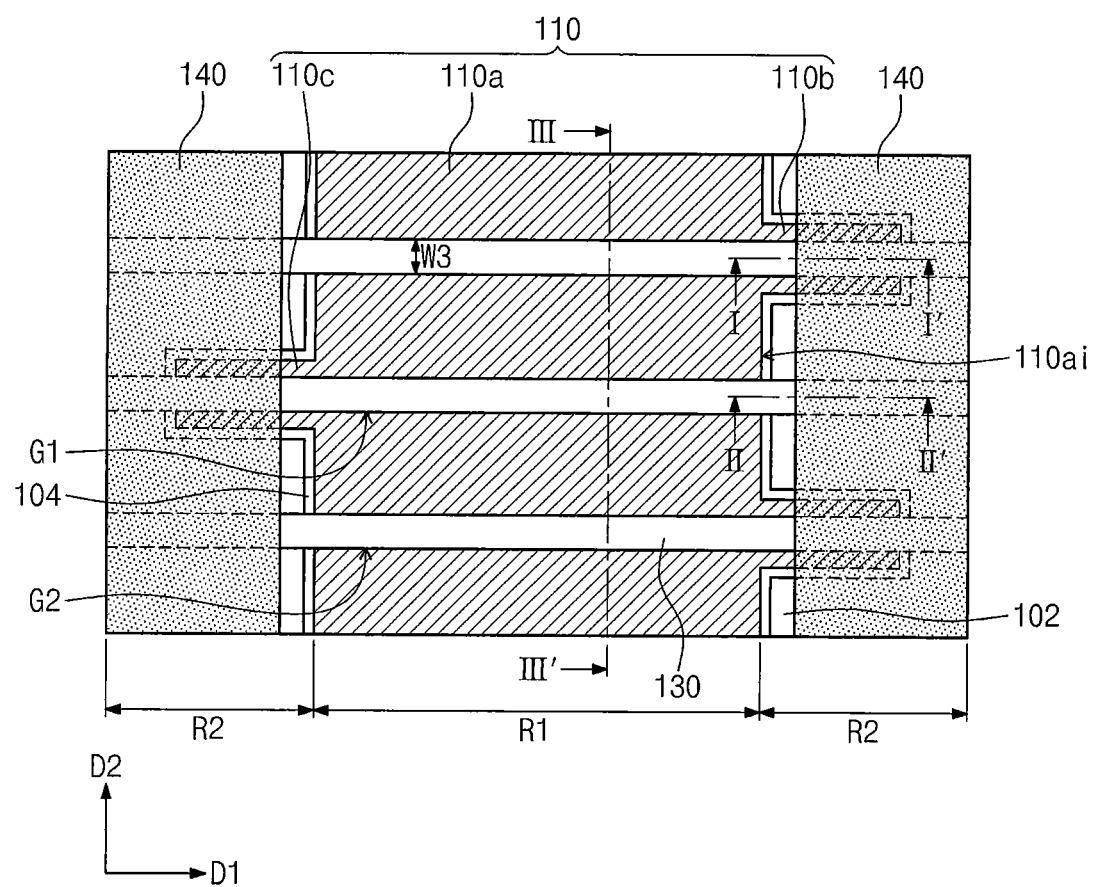
Figure 3B:
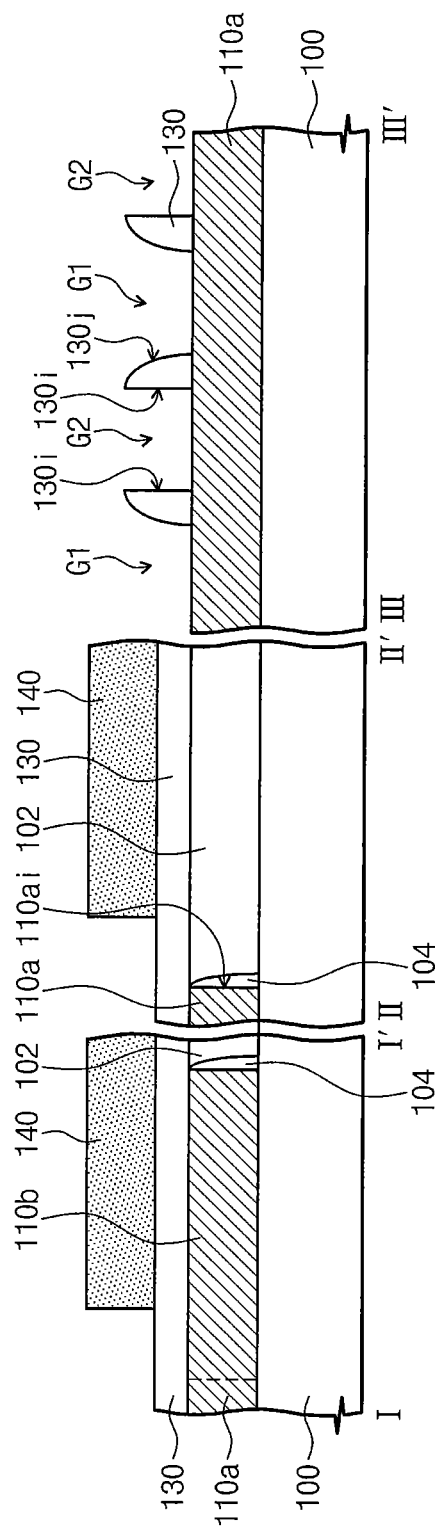

Referring to FIGS. 3A and 3B, the sacrificial patterns 120 may be removed. Accordingly, the first side surfaces 130i of the first mask patterns 130 and the conductive layer 110 between the first side surfaces 130i may be newly exposed to define second gap regions G2. The second gap regions G2 may be delimited by the first side surfaces 130i and the exposed top surface of the conductive layer 110. In other words, the first mask patterns 130 may be formed to define the first and second gap regions G1 and G2, each of which exposes the top surface of the conductive layer 110 and extends parallel to the first direction D1.

After the removal of the sacrificial patterns 120, a second mask pattern 140 may be formed on the second region R2 of the lower structure 100 to cover the protruding portions 110b and 110c. The second mask pattern 140 may be formed to cover at least a portion of each of the protruding portions 110b and 110c, a portion of the interlayered insulating layer 102, and a portion of the first spacer 104.

When viewed in plan view, the second mask pattern 140 may not overlap the plate portion 110a. For example, when viewed in plan view, the second mask pattern 140 may be formed spaced apart from the plate portion 110a. In other words, the second mask pattern 140 may be formed spaced apart from one side surface 110ai of the plate portion 110a adjacent thereto. In some embodiments, on the second region R2, the second mask pattern 140 may overlap each of the first mask patterns 130, when viewed in plan view. The second mask pattern 140 may be a photoresist pattern.

Figure 4A:
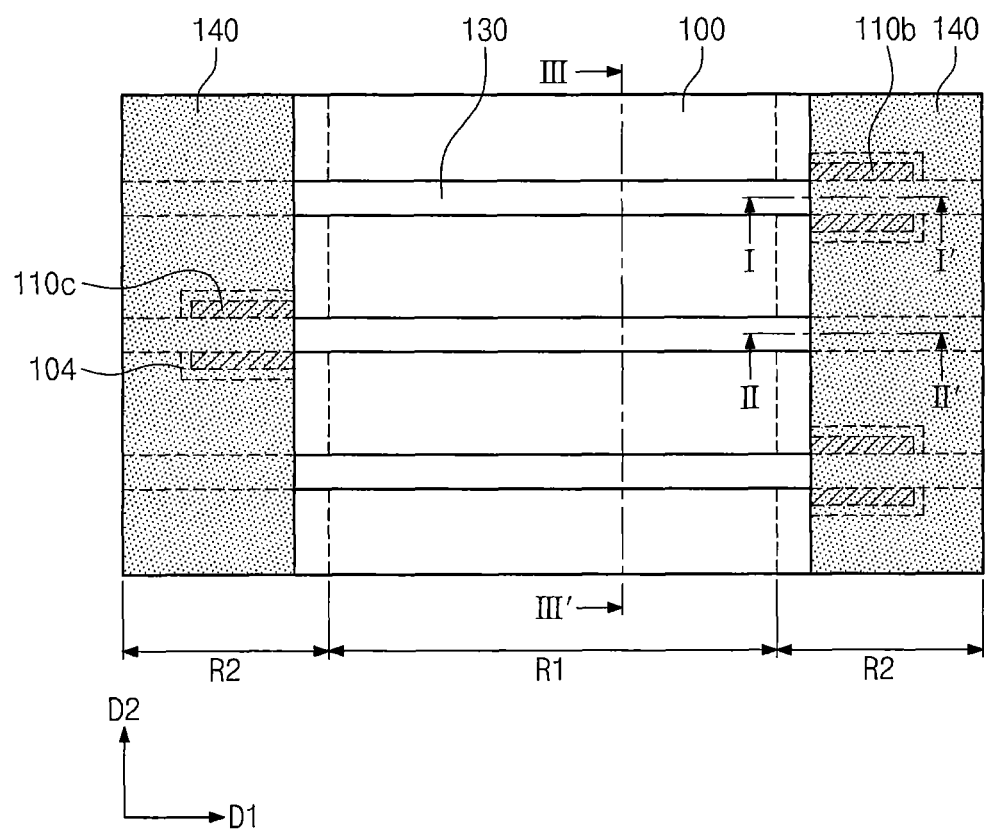
Figure 4B:
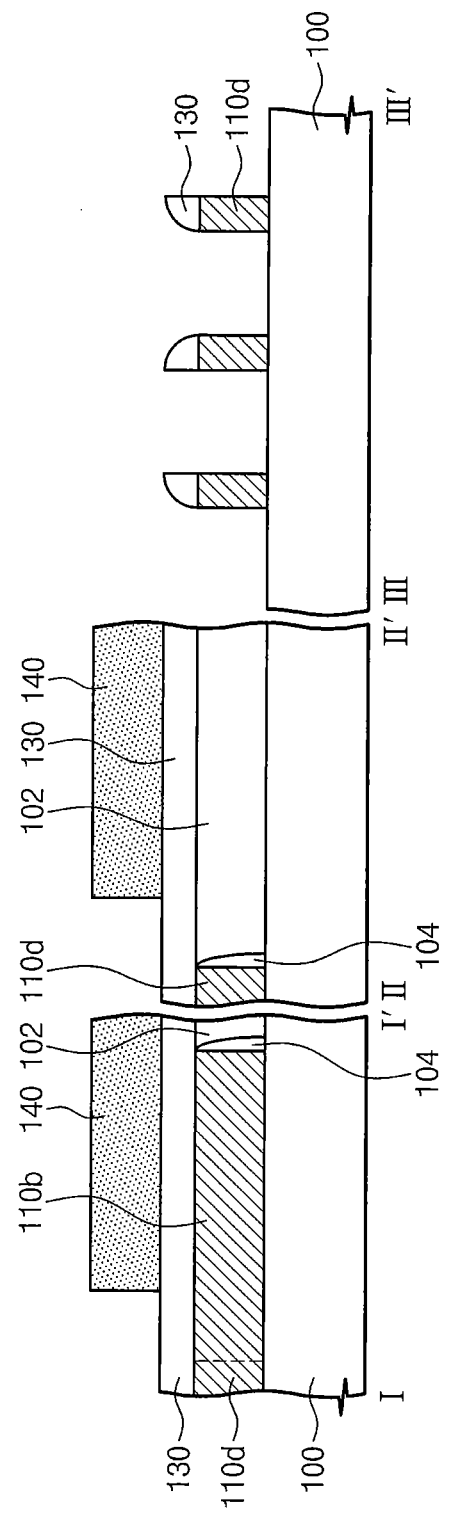

Referring to FIGS. 4A and 4B, the conductive layer 110 may be etched using the first and second mask patterns 130 and 140 as an etch mask. The etching of the conductive layer 110 may be performed using, for example, a dry etching process. As an example, the plate portion 110a of the conductive layer 110 may be etched using the first and second mask patterns 130 and 140 as the etch masks, and thus, a plurality of line patterns 110d may be formed on the first region R1 of the lower structure 100. The line patterns 110d may be formed to be parallel to the first direction D1 and may be spaced apart from each other in the second direction D2. During the etching process of the conductive layer 110, the lower structure 100 in the first region R1 may be exposed. Further, at least a portion of the protruding portions 110b and 110c may not be removed in the etching process to remain after the etching process. As an example, as shown in FIGS. 3A and 4A, each of the protruding portions 110b and 110c may be partially covered with the first and second mask patterns 130 and 140, whereas the remaining portions of the protruding portions 110b and 110c may not be covered by the first and second mask patterns 130 and 140. Accordingly, the remaining portions of the protruding portions 110b and 110c may be removed during the etching process. In addition, portions of the interlayered insulating layer 102 and the first spacer 104, in the second region R2 which are not covered by the first and second mask patterns 130 and 140 as shown in FIG. 3A, may be removed during the etching process.

Figure 5A:
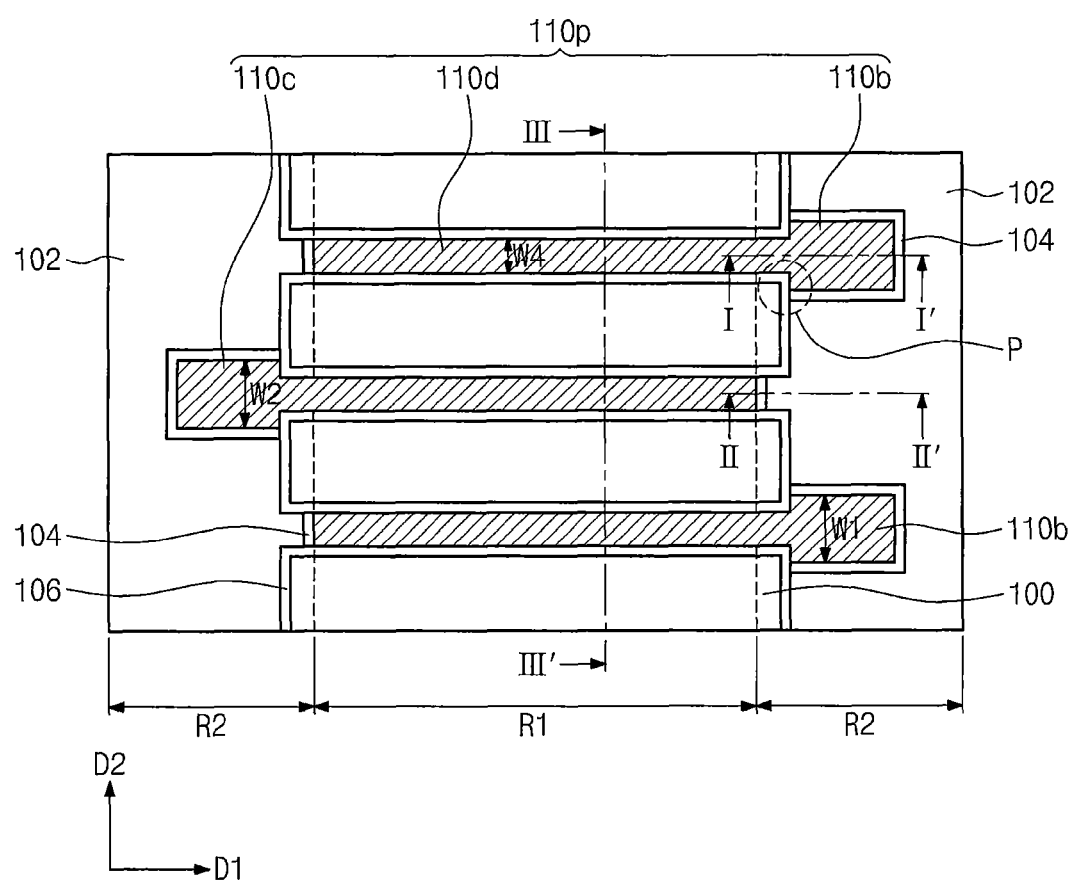
Figure 5B:
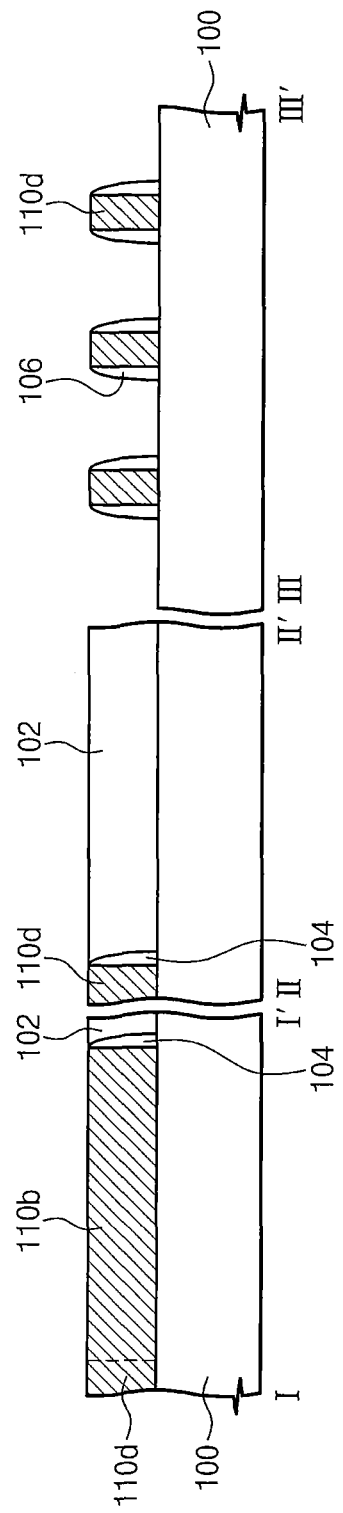
Figure 5C:
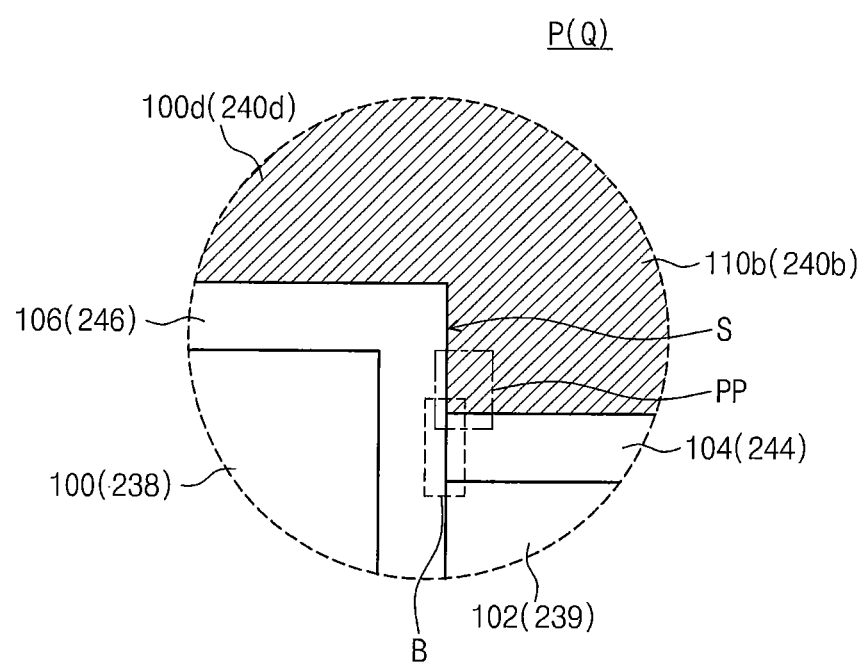
FIG. 5C is an enlarged sectional view illustrating a portion P of FIG. 5A.

Referring to FIGS. 5A, 5B, and 5C, after the etching process, the first and second mask patterns 130 and 140 may be removed. For example, the first mask patterns 130 may be removed using a wet etching process, and the second mask patterns 140 may be removed using an ashing and/or strip process. In some embodiments, the first and second mask patterns 130 and 140 may be removed using two different or independent processes, but some embodiments of the inventive concepts may not be limited thereto.

As a result of the removal of the first and second mask patterns 130 and 140, conductive patterns 110p may be formed on the lower structure 100. The conductive patterns 110p may include the line patterns 110d disposed on the first region R1 of the lower structure 100 and the protruding portions 110b and 110c disposed on the second region R2 of the lower structure 100. Each of the line patterns 110d may be connected to a corresponding one of the protruding portions 110b and 110c. In some embodiments, odd-numbered ones of the line patterns 110d may be connected to the first protruding portions 110b, respectively, and even-numbered ones of the line patterns 110d may be connected to the second protruding portions 110c, respectively. Each of the line patterns 110d may be continuously connected to the corresponding one of the protruding portions 110b and 110c, thereby forming a single body. When measured in the second direction D2, each of the line patterns 110d may have a fourth width W4. The fourth width W4 may be less than the first and second widths W1 and W2. In some embodiments, the line patterns 110d may serve as interconnection lines connected to the semiconductor substrate of the lower structure 100, and the protruding portions 110b and 110c may serve as contact pads, on which contacts connecting the line patterns 110d to a peripheral circuit are provided.

Side surfaces of the protruding portions 110b and 110c may be covered with the interlayered insulating layer 102, and the first spacer 104 may be interposed between the side surfaces of the protruding portions 110b and 110c and the interlayered insulating layer 102. As shown in FIG. 5C, each of the protruding portions 110b and 110c may have a side surface S which is positioned adjacent to the corresponding one of the line patterns 110d and is not covered with the interlayered insulating layer 102 and the first spacer 104.

An opposite end of each of the line patterns 110d may not be connected to any of the protruding portions 110b and 110c. The opposite end of each of the line patterns 110d may have a side surface that is spaced apart from the interlayered insulating layer 102 by the first spacer 104 to face the interlayered insulating layer 102.

Second spacers 106 may be formed to cover two opposite side surfaces of each of the line patterns 110d. The second spacer 106 may include at least one first portion, which extends along the first direction D1 and covers the side surfaces of the line pattern 110d, and at least one second portion, which extends along the second direction D2 and is in contact with the side surface S of the protruding portion 110b or 110c, as shown in FIG. 5C. The second portion of the second spacer 106 may further extend along the second direction D2 and may be in contact with the first spacer 104 and the interlayered insulating layer 102. The second spacer 106 may be in contact with the first spacer 104 at a boundary B therebetween as shown in FIG. 5C. The second spacer 106 may be formed of or include a silicon oxide layer, a silicon nitride layer, and/or a silicon oxynitride layer. The formation of the second spacer 106 may include forming a second spacer layer on the lower structure 100 to cover the conductive patterns 110p, the interlayered insulating layer 102, and the first spacer 104, and then anisotropically etching the second spacer layer to expose the top surfaces of the conductive patterns 110p. In some embodiments, the anisotropic etching process may be performed to expose the interlayered insulating layer 102 and the first spacer 104.

When viewed in plan view, as shown in FIG. 5C, each of the protruding portions 110b and 110c may have a pointed portion PP positioned near the boundary B between the first and second spacers 104 and 106.

According to some embodiments, the conductive layer 110 may be formed to include the plate portion 110a and the plurality of protruding portions 110b and 110c laterally extending from the plate portion 110a, and then, the first mask patterns 130 may be formed on the conductive layer 110 to have a line-shaped structure extending in a direction. Thereafter, the second mask pattern 140 may be formed to cover the protruding portions 110b and 110c, and then, the conductive layer 110 may be etched using both the first and second mask patterns 130 and 140 as an etch mask to form the conductive patterns 110p with the line patterns 110d and the protruding portions 110b and 110c. Here, each of the protruding portions 110b and 110c can be continuously connected to a corresponding one of the line patterns 110d to form a single body. Further, the protruding portions 110b and 110c can be formed wider than the line patterns 110d in the second direction D2. In other words, by using fine patterning methods according to some embodiments, it is possible to provide such a structure of the conductive patterns 110p.

FIGS. 6A through 10A are plan views illustrating a method of fabricating a semiconductor device, using the fine patterning method according to some embodiments of the inventive concept. FIG. 6B is a diagram illustrating vertical sections taken along lines I-I', II-II', and III-III' of FIG. 6A, and FIGS. 7B through 10B are diagrams illustrating vertical sections taken along lines I-I', II-II', III-III', and IV-IV' of FIGS. 7A through 10A, respectively. For concise description, an element previously described with reference to FIGS. 1A through 5A and FIGS. 1B through 5B may be identified by a similar or identical reference number without repeating an overlapping description thereof.

Figure 6A:
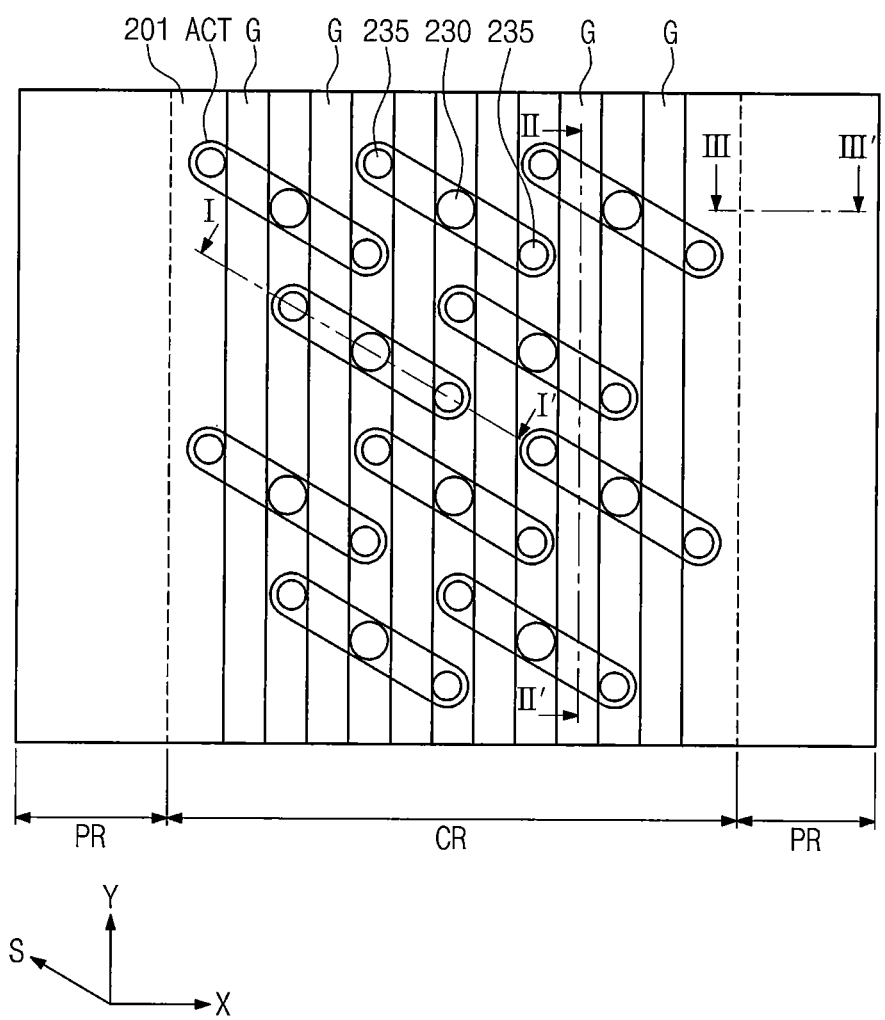
Figure 6B:
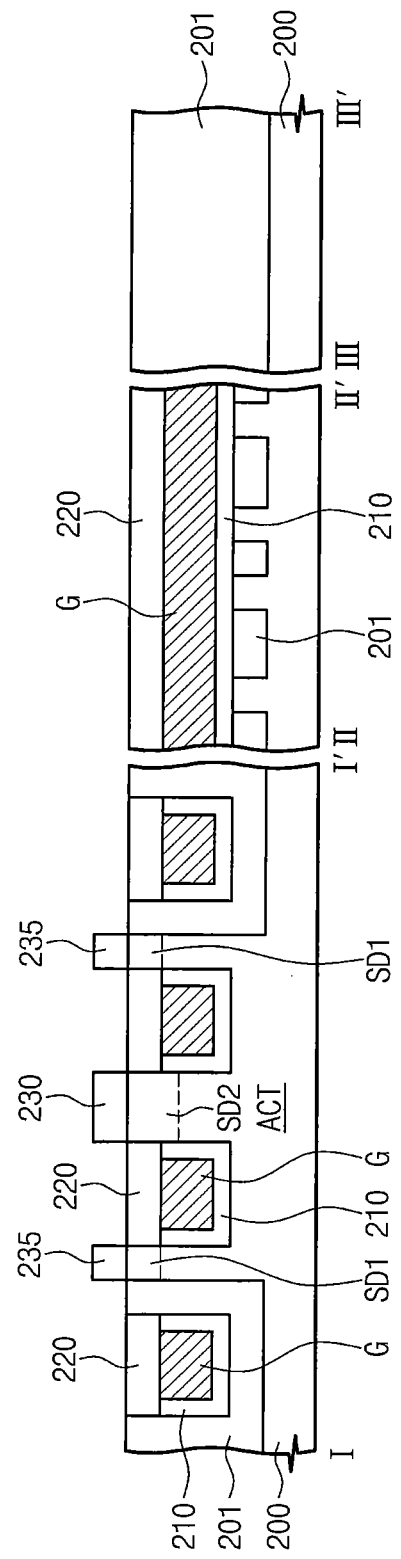
FIG. 6B is a diagram illustrating vertical sections taken along lines I-I', II-II', and III-III' of FIG. 6A.

Referring to FIGS. 6A and 6B, a substrate 200 with a cell region CR and a peripheral circuit region PR may be provided. The cell region CR may be a region of the substrate 200, on which memory cells are located, whereas the peripheral circuit region PR may be another region of the substrate 200 on which peripheral circuits are provided. In some embodiments, the substrate 200 may be a semiconductor substrate (e.g., a silicon, germanium, or silicon-germanium wafer).

A device isolation layer 201 may be formed on the substrate 200 to define active regions ACT. The device isolation layer 201 may be formed using, for example, a shallow trench isolation (STI) process. The device isolation layer 201 may include a silicon nitride layer, a silicon oxide layer, and/or a silicon oxynitride layer. When viewed in plan view, the active region ACT may be formed to have a bar shape and may be formed in such a way that a longitudinal axis thereof is parallel to a third or S direction. Here, the third or S direction is not parallel to the first and second (or X and Y) directions. The first and second directions are not parallel to (for example, orthogonal to) each other.

First doped regions SD1 may be formed in the active region ACT of the substrate 200. The first doped regions SD1 may be formed by an ion implantation process. As an example, the first doped region SD1 may be doped with N-type dopants.

Gate lines G may be formed on the cell region CR of the substrate 200 to cross the active region ACT when viewed in plan view. The gate lines G may extend parallel to the second direction Y and may be formed spaced apart from each other in the first direction X. In some embodiments, the gate lines G may be formed buried in the substrate 200. The gate lines G may be formed of or include a conductive material. The conductive material for the gate lines G may be at least one of for example, doped semiconductor materials (e.g., doped silicon, doped germanium, and so forth), conductive metal nitrides (e.g., titanium nitride, tantalum nitride, and so forth), metals (e.g., tungsten, titanium, tantalum, and so forth), and metal-semiconductor compounds (e.g., tungsten silicide, cobalt silicide, titanium silicide, and so forth).

Gate insulating patterns 210 may be formed between the gate lines G and the active region ACT and between the gate lines G and the device isolation layer 201. The gate insulating patterns 210 may be formed of or include at least one of oxide, nitride, oxynitride materials or other materials. First capping patterns 220 may be formed on the gate lines G, respectively. The first capping patterns 220 may be formed to have top surfaces that are substantially coplanar with that of the substrate 200. The first capping patterns 220 may include a silicon oxide layer, a silicon nitride layer, and/or a silicon oxynitride layer. In some embodiments, each of the first capping patterns 220 may have a bottom surface, which may be in contact with the top surfaces of the gate insulating patterns 210, and side surfaces in contact with the active region ACT and/or the device isolation layer 201. In some embodiments, the gate insulating patterns 210 may extend between the first capping patterns 220 and the active region ACT and/or between the first capping patterns 220 and the device isolation layer 201. In this case, the first capping patterns 220 may include a silicon nitride layer, and the gate insulating patterns 210 may include a silicon oxide layer. Here, the gate insulating patterns 210 between the first capping patterns 220 and the active region ACT may be configured to relieve stress between the active region ACT and the first capping patterns 220 or to serve as a buffer layer.

An ion implantation process may be performed to form second doped regions SD2 in the active region ACT and between adjacent pairs of the gate lines G. The second doped regions SD2 may be doped (for example, with N-type impurities) to have the same conductivity type as the first doped region SD1. In the substrate 200, the second doped regions SD2 may be formed to have a depth greater than that of the first doped regions SD1.

A doped poly-crystalline silicon layer, a doped single-crystalline silicon layer, or a conductive layer may be formed on the substrate 200, the conductive layer may be patterned to form first pads 235 and second pads 230. The first pads 235 may be connected to the first doped regions SD1, respectively, and the second pads 230 may be connected to the second doped regions SD2, respectively. In the case where a semiconductor layer is used to form the first and second pads 235 and 230, it may be doped in such a way that the first and second pads 235 and 230 have the same conductivity type as the first and second doped regions SD1 and SD2 on which the pads 235 and 230 are formed.

Figure 7A:
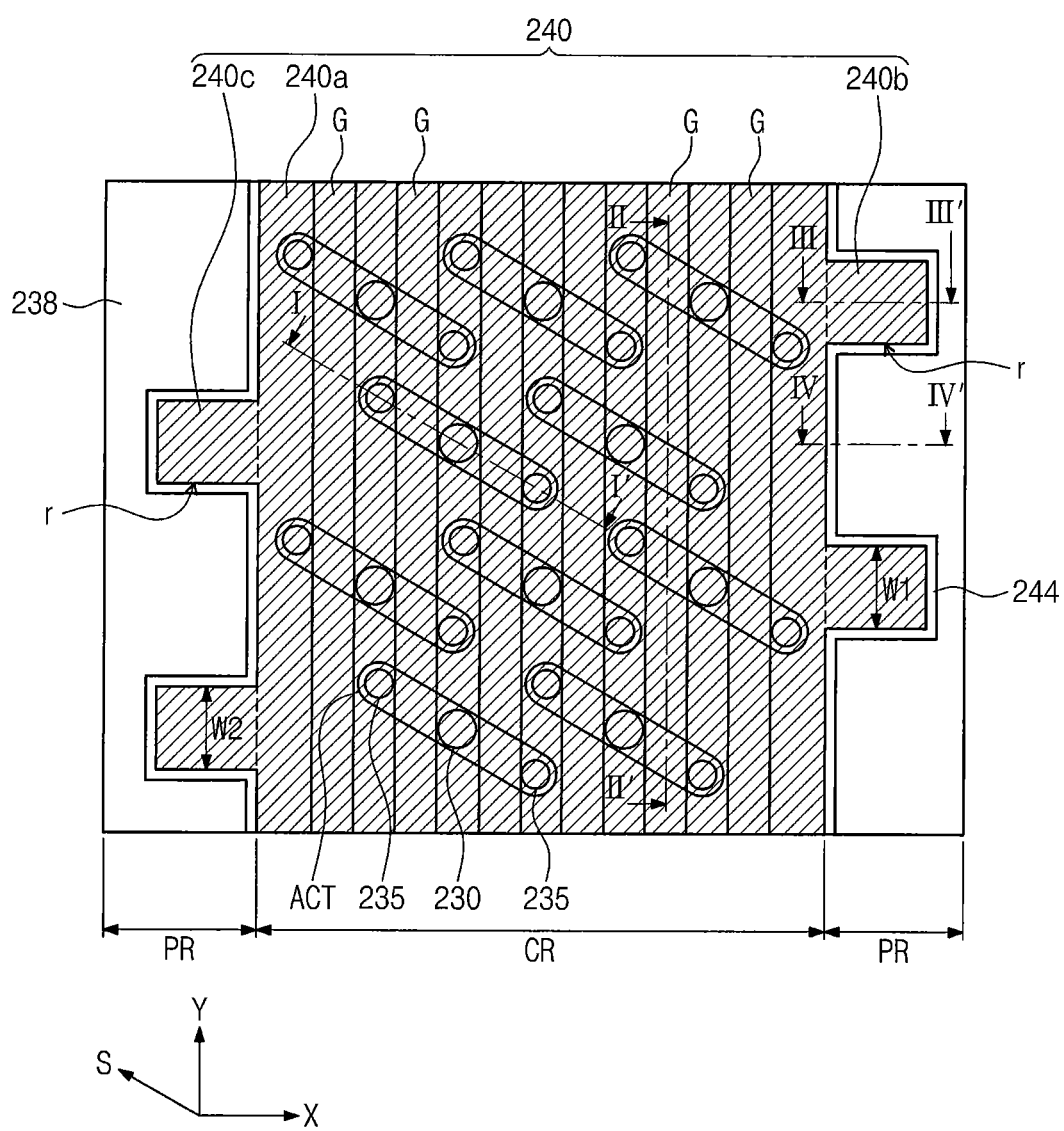
Figure 7B:
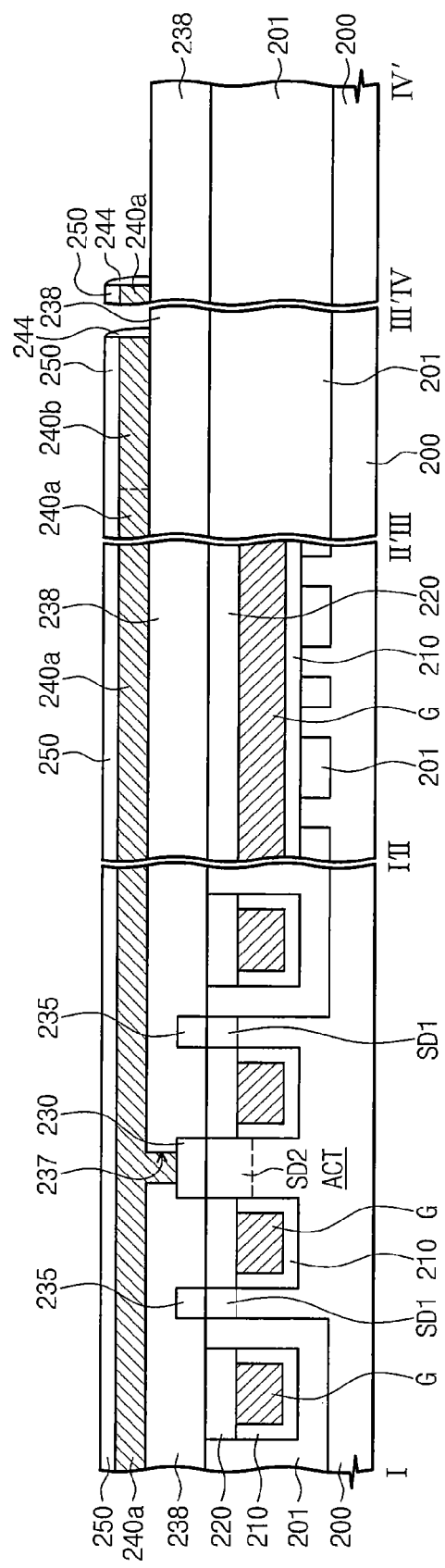

Referring to FIGS. 7A and 7B, a first interlayered insulating layer 238 may be formed on the substrate 200 to cover the first and second pads 235 and 230. The first interlayered insulating layer 238 may cover the cell region CR and the peripheral circuit region PR. The first interlayered insulating layer 238 may include a silicon oxide layer, a silicon nitride layer, and/or a silicon oxynitride layer. The first interlayered insulating layer 238 may be patterned to form through holes 237 penetrating the first interlayered insulating layer 238 to expose the second pad 230, on the cell region CR.

A conductive layer 240 may be formed on the first interlayered insulating layer 238. The conductive layer 240 may be formed in the through holes 237. The conductive layer 240 may include a plate portion 240a and a plurality of protruding portions. The plate portion 240a may cover the first interlayered insulating layer 238 located on the cell region CR, and each of the protruding portions may extend from the plate portion 240a in a direction parallel to a top surface of the substrate 200 and may cover a portion of the first interlayered insulating layer 238 located on the peripheral circuit region PR. The plurality of protruding portions may include first protruding portions 240b, which extend from the plate portion 240a toward the first direction X and cover a portion of the first interlayered insulating layer 238 on the peripheral circuit region PR, and second protruding portions 240c, which extend from the plate portion 240a toward a direction opposite to the first direction X and cover another portion of the first interlayered insulating layer 238 on the peripheral circuit region PR.

The first protruding portions 240b may be spaced apart along the second direction Y, and thus, the plate portion 240a may have a side surface exposed between each directly adjacent pair of the first protruding portions 240b. In other words, the conductive layer 240 may have an uneven side surface defined by the first protruding portions 240b. Similarly, the second protruding portions 240c may be spread apart along the second direction Y, and thus, the plate portion 240a may also have an opposite side surface that is exposed between each directly adjacent pair of the second protruding portions 240c. In other words, the conductive layer 240 may also have an uneven opposite side surface defined by the second protruding portions 240c. Here, the plate portion 240a may be provided in such a way that the two side surfaces thereof face each other, and the conductive layer 240 may be provided in such a way that the two side surfaces thereof face each other. The first and second protruding portions 240b and 240c may be provided in such a way that the conductive layer 240 does not have mirror symmetry with respect to a line parallel to the second direction Y.

When measured in the second direction Y, each of the first protruding portions 240b may have a first width W1, and each of the second protruding portions 240c may have a second width W2. In some embodiments, the first and second widths W1 and W2 may be substantially the same.

The conductive layer 240 may be formed of or include at least one of, for example, doped semiconductor materials (e.g., doped silicon, doped germanium, and so forth), conductive metal nitrides (e.g., titanium nitride, tantalum nitride, and so forth), metals (e.g., tungsten, titanium, tantalum, and so forth), and metal-semiconductor compounds (e.g., tungsten silicide, cobalt silicide, titanium silicide, and so forth).

In some embodiments, a capping layer 250 may be formed on the conductive layer 240. The capping layer 250 may be locally provided on a top surface of the conductive layer 240. The capping layer 250 may be formed of or include at least one of a silicon nitride layer, a silicon oxide layer, or a silicon oxynitride layer.

The formation of the conductive and capping layers 240 and 250 may include forming a preliminary conductive and capping layers (not shown) on the first interlayered insulating layer 238 to cover the cell region CR and the peripheral circuit region PR, and then, patterning the preliminary conductive and capping layers to form recess regions r defining the protruding portions 240b and 240c, on the peripheral circuit region PR. As a result of the patterning process, the capping layer 250 can be locally provided on the top surface of the conductive layer 240.

First spacers 244 may be formed on the side surfaces of the conductive layer 240. The first spacers 244 may be formed of or include a silicon oxide layer, a silicon nitride layer, and/or a silicon oxynitride layer. The formation of the first spacer 244 may include forming a first spacer layer on the first interlayered insulating layer 238 to cover the conductive layer 240, and then, anisotropically etching the first spacer layer. The anisotropic etching process may be performed to expose top surfaces of the conductive layer 240 and the first interlayered insulating layer 238.

Figure 8A:
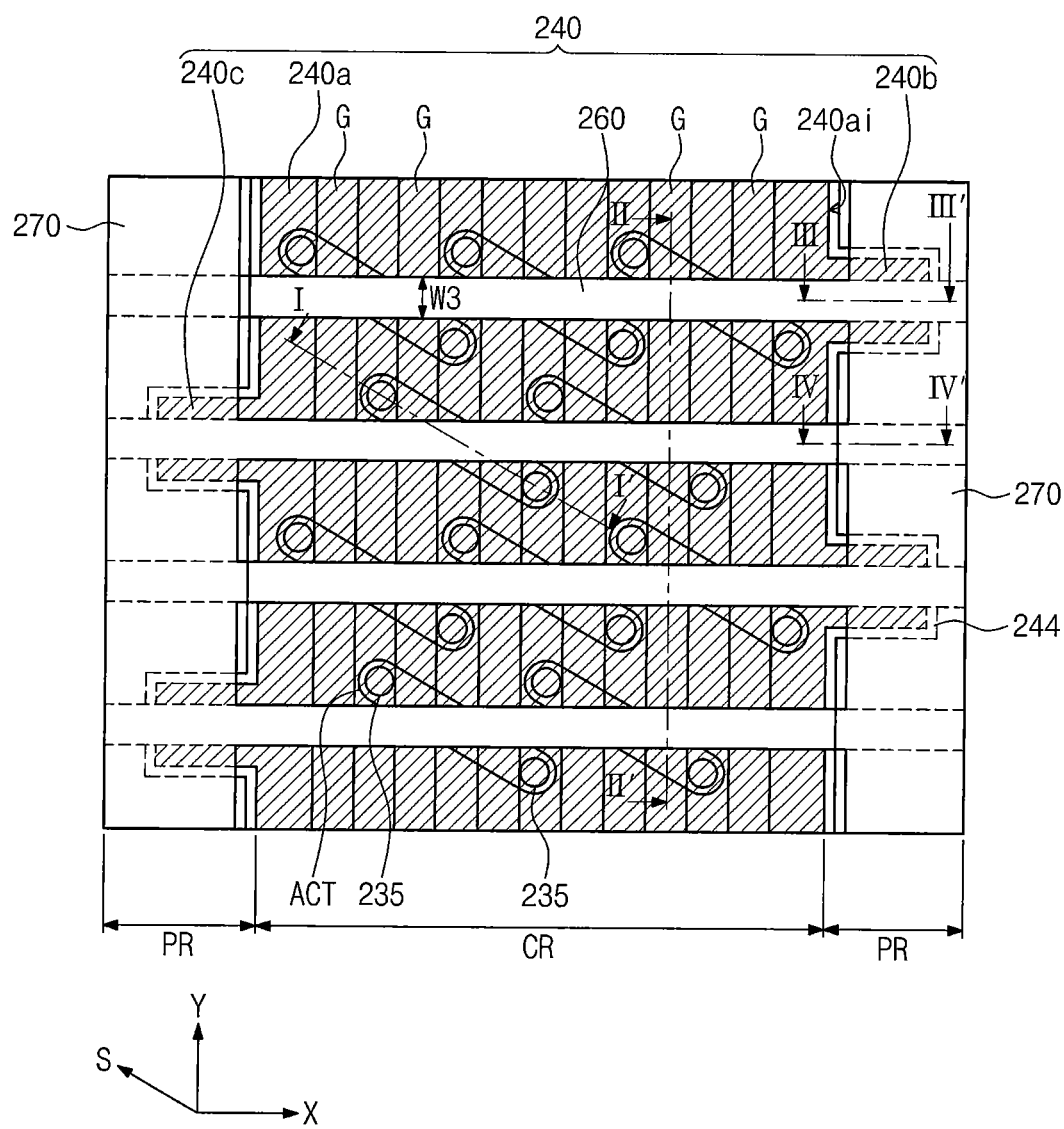
Figure 8B:
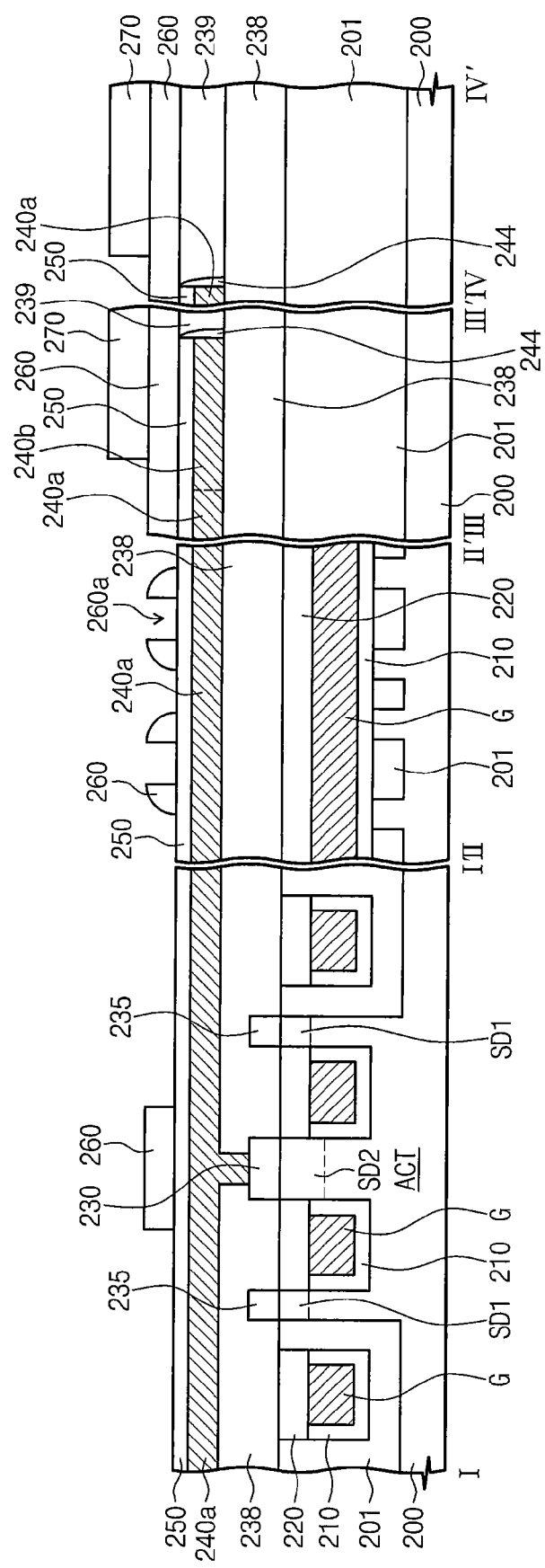

Referring to FIGS. 8A and 8B, a second interlayered insulating layer 239 may be formed on the first interlayered insulating layer 238 to surround the conductive layer 240 and the capping layer 250. The second interlayered insulating layer 239 may include, for example, a silicon oxide layer. The first spacer 244 may be interposed between the side surfaces of the second interlayered insulating layer 239 and the conductive layer 240 and between the side surfaces of the second interlayered insulating layer 239 and the capping layer 250. Thereafter, cell mask patterns 260 may be formed on the capping layer 250. The cell mask patterns 260 may extend parallel to the first direction X and may be spaced apart from each other in the second direction Y. The cell mask patterns 260 may include, for example, a silicon oxide layer. The cell mask patterns 260 may be formed to define cell openings 260a exposing a top surface of the capping layer 250.

When viewed in plan view, each of the cell mask patterns 260 may be formed in such a way to overlap a corresponding one of the protruding portions 240b and 240c. For example, odd-numbered ones of the cell mask patterns 260 may overlap with the first protruding portions 240b, respectively, and even-numbered ones of the cell mask patterns 260 may be overlapped with the second protruding portions 240c, respectively.

When measured in the second direction Y, each of the cell mask patterns 260 may have a third width W3. In some embodiments, the third width W3 may be less than the first and second widths W1 and W2. The cell mask patterns 260 may be formed using the same method as that for the first mask patterns 130 described, for example, with reference to FIGS. 2A, 2B, 3A, and 3B.

Next, peripheral mask patterns 270 may be formed on the capping layer 250 of the peripheral circuit region PR to cover the protruding portions 240b and 240c. The peripheral mask patterns 270 may be formed to cover at least one portion of each of the protruding portions 240b and 240c, a portion of the second interlayered insulating layer 239, and a portion of the first spacer 244. When viewed in plan view, the peripheral mask pattern 270 may not overlap the plate portion 240a. For example, when viewed in plan view, the peripheral mask pattern 270 may be formed spaced apart from the plate portion 240a. In other words, the peripheral mask pattern 270 may be formed spaced apart from one side surface 240ai of the plate portion 240a adjacent thereto. In some embodiments, when viewed in plan view, the peripheral mask pattern 270 overlaps each of the cell mask patterns 260, in the peripheral circuit region PR. The peripheral mask pattern 270 may be a photoresist pattern.

Figure 9A:
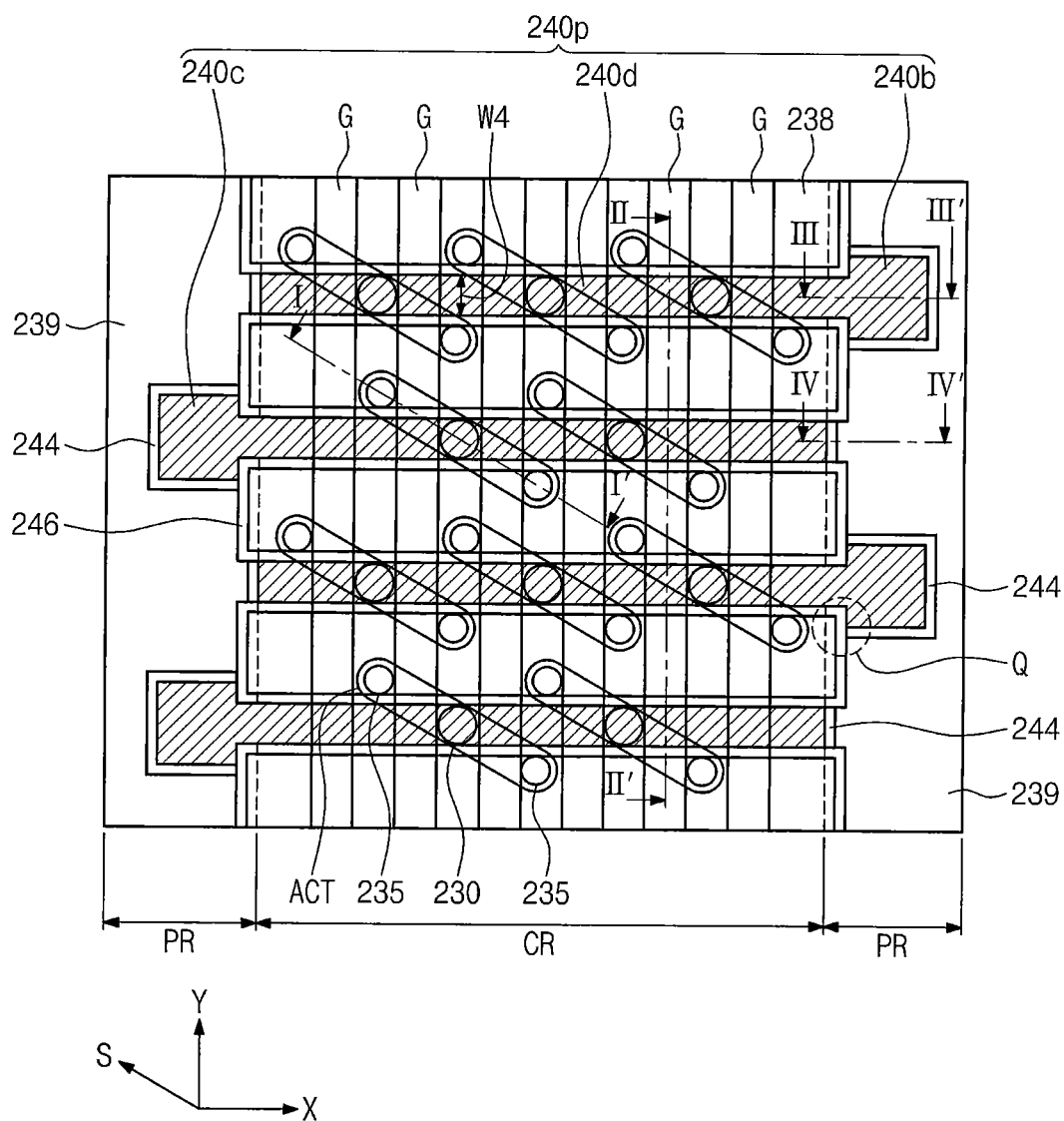

Referring to FIGS. 9A and 9B, the capping layer 250 and the conductive layer 240 may be patterned using the cell and peripheral mask patterns 260 and 270 as an etch mask to form second capping patterns 250a and conductive patterns 240p on the first interlayered insulating layer 238. The second capping patterns 250a and the conductive patterns 240p may be formed using the same method as that for the conductive patterns 110p described with reference to, for example, FIGS. 4A, 4B, 5A, and 5B.

The conductive patterns 240p may include bit lines 240d disposed on the first interlayered insulating layer 238 of the cell region CR and the protruding portions 240b and 240c disposed on the first interlayered insulating layer 238 of the peripheral circuit region PR. Each of the bit lines 240d may be connected to a corresponding one of the protruding portions 240b and 240c. In some embodiments, odd-numbered ones of the bit lines 240d may be connected to the first protruding portions 240b, respectively, and even-numbered ones of the bit lines 240d may be connected to the second protruding portions 240c, respectively. Each of the bit lines 240d may be continuously connected to the corresponding one of the protruding portions 240b and 240c, thereby forming a single body. When measured in the second direction Y, each of the bit lines 240d may have a fourth width W4. The fourth width W4 may be less than the first and second widths W1 and W2.

In some embodiments, each of the bit lines 240d may be electrically connected to the second doped regions SD2 of the active region ACT through first contacts 242 penetrating the first interlayered insulating layer 238. The protruding portions 240b and 240c, may serve as contact pads, on which contacts for applying a voltage to the bit lines 240d may be provided.

The second capping patterns 250a may be locally formed on top surfaces of the conductive patterns 240p, respectively A portion Q denoted in FIG. 9A may have substantially the same structure as that shown in FIG. 5C.

Referring to FIGS. 9A and 9B in conjunction with FIG. 5C, side surfaces of the protruding portions 240b and 240c may be covered with the second interlayered insulating layer 239, and the first spacer 244 may be between the protruding portions 240b and 240c and the second interlayered insulating layer 239. As shown in FIG. 5C, each of the protruding portions 240b and 240c may have a side surface S which is positioned adjacent to the corresponding one of the bit lines 240d and is not covered with the second interlayered insulating layer 239 and the first spacer 244.

An opposite end of each of the bit lines 240d may not be connected to any of the protruding portions 240b and 240c. The opposite end of each of the bit lines 240d may have a side surface which is spaced apart from the second interlayered insulating layer 239 by the first spacer 244 to face the second interlayered insulating layer 239.

Second spacers 246 may be formed to cover two opposite side surfaces of each of the bit lines 240d. The second spacers 246 may include at least one first portion, which extends along the first direction X and covers the side surfaces of the bit lines 240d, and at least one second portion, which extends along the second direction Y and is in contact with the side surface S of the protruding portion 240b or 240c. The second portion of the second spacer 246 may further extend along the second direction Y and may be in contact with the first spacer 244 and the second interlayered insulating layer 239. The second spacer 246 may be in contact with the first spacer 244 at a boundary B therebetween. The second spacers 246 may be formed of or include a silicon oxide layer, a silicon nitride layer, and/or a silicon oxynitride layer. The formation of the second spacer 246 may include forming a second spacer layer on the first interlayered insulating layer 238 to cover the bit lines 240d, the second interlayered insulating layer 239, and the first spacer 244, and then, anisotropically etching the second spacer layer to expose top surfaces of the bit lines 240d. The anisotropic etching process may be performed to expose top surfaces of the first interlayered insulating layer 238, the second interlayered insulating layer 239 and the first spacer 244.

When viewed in plan view, as shown in FIG. 5C, each of the protruding portions 240b and 240c may have a pointed portion PP (or corner) positioned near the boundary B between the first and second spacers 244 and 246.

Figure 10A:
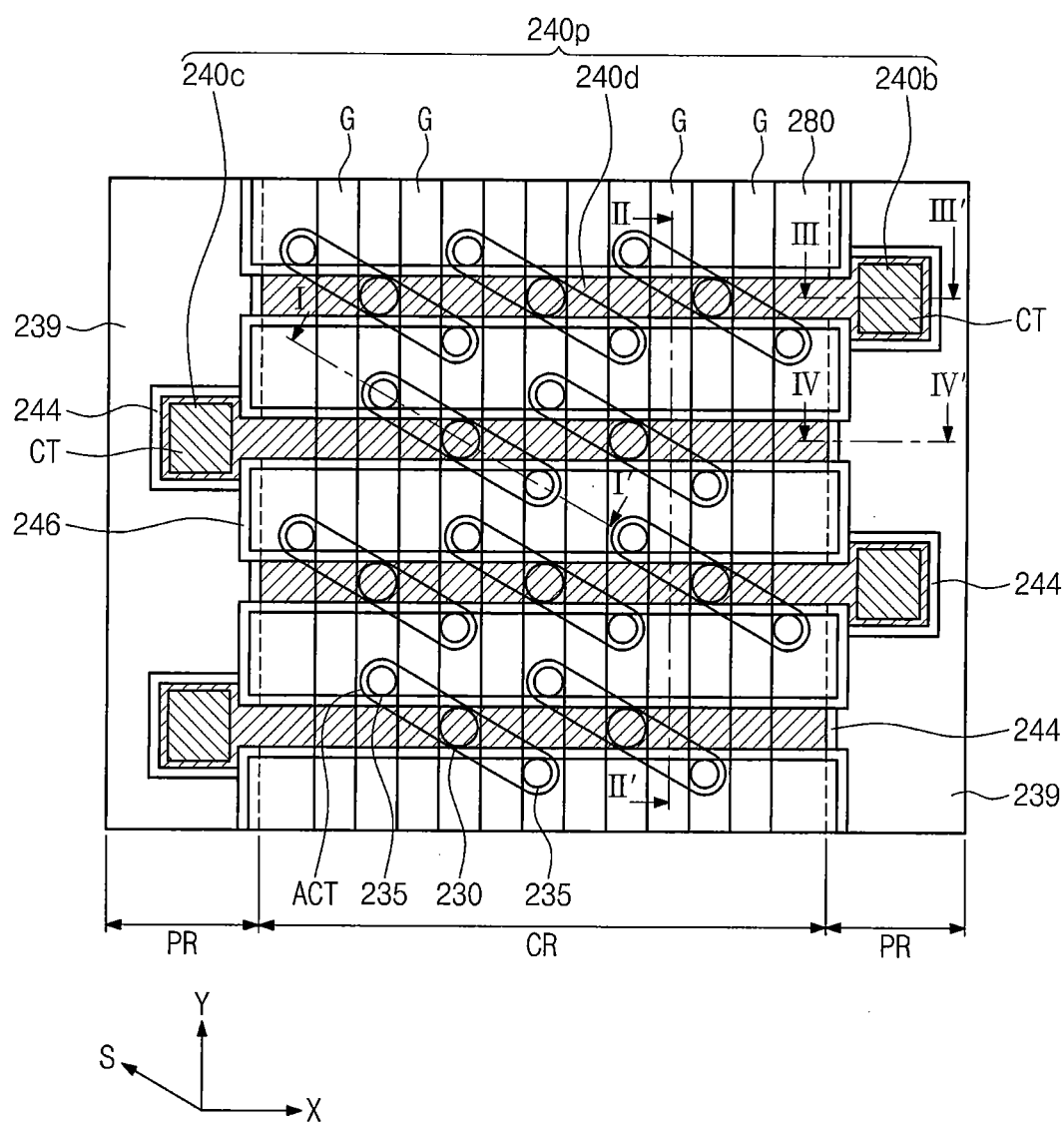
Figure 10B:
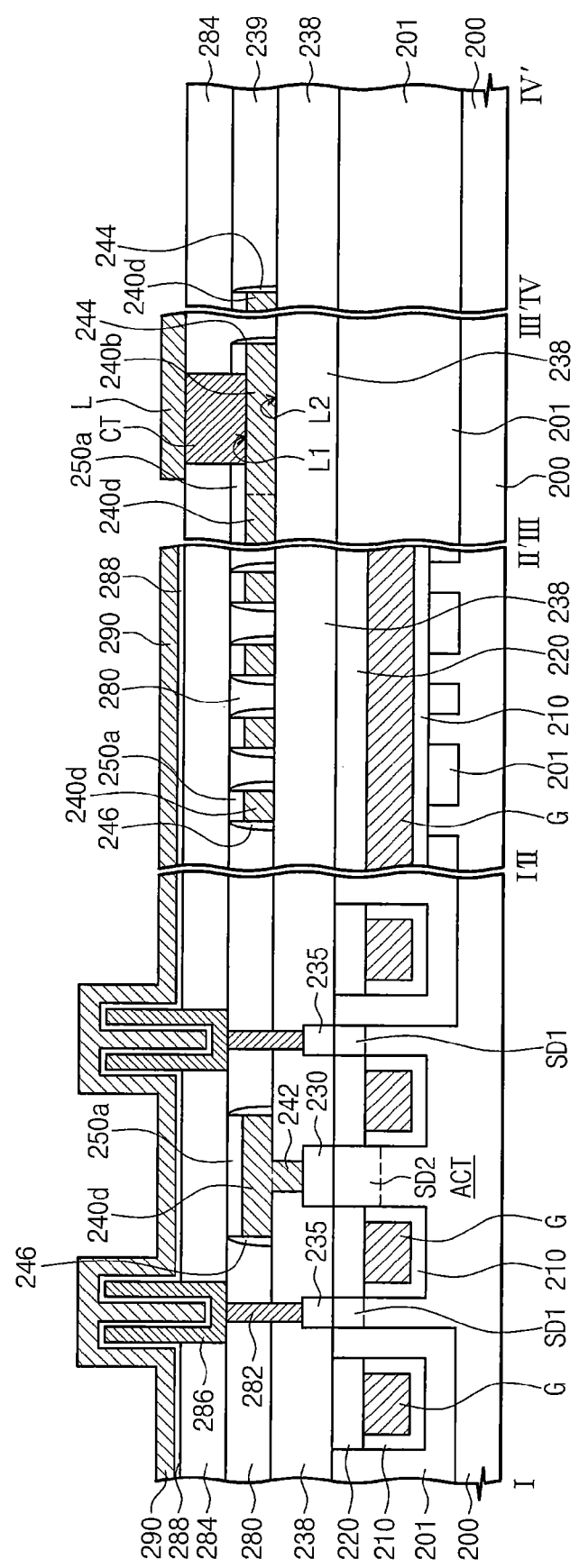

Referring to FIGS. 10A and 10B, a third interlayered insulating layer 280 may be formed on the first interlayered insulating layer 238 to cover the side surfaces of the bit lines 240d. The third interlayered insulating layer 280 may be formed to fill gap regions between the bit lines 240d. The second spacer 246 may be interposed between the side surfaces of the bit lines 240d and the third interlayered insulating layer 280 and between the second and third interlayered insulating layers 239 and 280. The second interlayered insulating layer 239 may be formed to have a top surface that is substantially coplanar with that of the third interlayered insulating layer 280. The third interlayered insulating layer 280 may be formed of or include a silicon oxide layer, a silicon nitride layer, and/or a silicon oxynitride layer. The bit lines 240d and the second capping patterns 250a may be formed in the third interlayered insulating layer 280, and insulating spacers 252 may be formed on side surfaces of the bit lines 240d and the second capping patterns 250a. The insulating spacers 252 may be formed of or include at least one of a silicon nitride layer, a silicon oxide layer, and/or a silicon oxynitride layer.

Buried contacts 282 may be formed on the cell region CR of the substrate 200. The buried contacts 282 may be connected to the first pads 235, respectively, through the first and third interlayered insulating layers 238 and 280. The buried contacts 282 may include a conductive material such as doped silicon, metals or other materials. Memory elements may be formed on the third interlayered insulating layer 280 and may be connected to the buried contacts 282, respectively. In some embodiments, the memory element may be a capacitor including a lower electrode 286, an upper electrode 290, and a dielectric layer 288 between the lower and upper electrodes 286 and 290. The lower electrode 286 may be formed to have a bottom-closed cylindrical shape. The upper electrode 290 may be formed to commonly cover the lower electrodes 286 of the memory elements. The lower and upper electrodes 286 and 290 may include at least one of doped silicon, metals, metal compounds or other materials. A supporting layer 284 may be formed between the upper electrode 290 and the third interlayered insulating layer 280. The supporting layer 284 may be provided to support outer sidewalls of the lower electrodes 286 and thereby prevent the lower electrodes 286 from falling or leaning. The supporting layer 284 may include an insulating material. The dielectric layer 288 may be laterally extended and may be between the supporting layer 284 and the upper electrode 290.

The supporting layer 284 may be extended toward the peripheral circuit region PR to cover the second interlayered insulating layer 239. Second contacts CT may be formed to penetrate the supporting layer 284 and the second capping pattern 250a and may be connected to the protruding portions 240b and 240c, respectively. When viewed in a sectional view, each of the second contacts CT may have a bottom surface L1 that is in contact with a corresponding one of the protruding portions 240b and 240c and is positioned at a higher level than a bottom surface L2 of the protruding portions 240b and 240c. In some embodiments, the protruding portions 240b and 240c may have the first and second widths W1 and W2 that are greater than the fourth width W4 of the bit lines 240d, and a top area of each of the protruding portions 240b and 240c may be substantially equal to or greater than an area of the bottom surface L1 of each of the second contacts CT. Accordingly, the second contacts CT can be respectively formed on the protruding portions 240b and 240c with increased contact area, compared with the case that the second contact CT is directly formed on an end portion of the bit line 240d, and thus, it is possible to reduce contact resistance between the second contacts CT and the protruding portions 240b and 240c. Thereafter, interconnection lines L may be formed on the supporting layer 284 of the peripheral circuit region PR. The interconnection lines L may be connected to the second contacts CT and may be used as paths for delivering signals from or to the bit lines 240d.

According to some embodiments, the conductive layer 240 may be formed to include the plate portion 240a and the plurality of protruding portions 240b and 240c laterally extending from the plate portion 240a, and then, the cell mask patterns 260 may be formed on the conductive layer 240 to have a line-shaped structure extending in a direction. Thereafter, the peripheral mask pattern 270 may be formed to cover the protruding portions 240b and 240c, and then, the conductive layer 240 may be etched using both the cell and peripheral mask patterns 260 and 270 as an etch mask to form the conductive patterns 240p to include the bit lines 240d and the protruding portions 240b and 240c. Here, each of the protruding portions 240b and 240c can be continuously connected to a corresponding one of the bit lines 240d to form a single body. Further, the protruding portions 240b and 240c can be formed to have a width and area that is greater than that of the bit lines 240d. In other words, by using the fine patterning method according to the inventive concept, it is possible to realize such a structure of the conductive patterns 240p.

In addition, the conductive layer 240 may be formed to include the plate portion 240a and the protruding portions 240b and 240c, and the peripheral mask pattern 270 may be formed to cover the protruding portions 240b and 240c. Accordingly, it is possible to reduce an area of insulating layers that are positioned directly adjacent to the conductive layer 240 and are exposed by the peripheral mask pattern 270. As a result, it is possible to suppress end portions of the bit lines 240d from being narrowed by an etch residue, which may be produced from the insulating layers in the etching process for forming the bit lines 240d.

Furthermore, since the second contacts CT are formed on the protruding portions 240b and 240c, it is possible to reduce contact resistance therebetween, when a voltage is applied to the bit lines 240d. Accordingly, embodiments according to the inventive concept can be used to fabricate a semiconductor device having reduced contact resistance.

Hereinafter, structural features of a semiconductor device, which is fabricated using the fine patterning method according to some embodiments of the inventive concept, will be described with reference to FIGS. 10A, 10B, and 5C.

Referring to FIGS. 10A and 10B in conjunction with FIG. 5C, the substrate 200 with the cell region CR and the peripheral circuit region PR may be provided. The device isolation layer 201 may be provided on the substrate 200 to define active regions ACT. When viewed in plan view, the active region ACT may be formed to have a bar shape and may be formed in such a way that a longitudinal axis thereof is parallel to a third or S direction. Here, the third or S direction is not parallel to any of a first and second (or X and Y) directions. The first and second directions are not parallel to (for example, orthogonal to) each other.

When viewed in plan view, the gate lines G may be provided within the cell region CR of the substrate 200 to cross the active regions ACT. The gate lines G may extend parallel to the second direction Y and may be spaced apart from each other in the first direction X. The gate lines G may be buried in the substrate 200. The gate insulating patterns 210 may be provided between the gate lines G and the active regions ACT and between the gate lines G and the device isolation layer 201. The first capping patterns 220 may be provided on the top surfaces of the gate lines G, respectively. The first capping patterns 220 may be provided to have top surfaces that are substantially coplanar with that of the substrate 200.

The second doped regions SD2 may be formed in portions of the active regions ACT, respectively, which are located between each directly adjacent pair of the gate lines G. The first doped regions SD1 may be formed in other portions (e.g., opposite end portions) of the active regions ACT, which are spaced apart from each other with each directly adjacent pair of the gate lines G therebetween. In the substrate 200, the second doped regions SD2 may be formed to have a depth greater than that of the first doped regions SD1. The first and second pads 235 and 230 may be provided on the substrate 200 and may be connected to the first and second doped regions SD1 and SD2, respectively. The first interlayered insulating layer 238 may be provided on the substrate 200 to cover the first and second pads 235 and 230. The first interlayered insulating layer 238 may be provided to cover the cell region CR and the peripheral circuit region PR.

The conductive patterns 240p may be provided on the first interlayered insulating layer 238. The conductive patterns 240p may include the bit lines 240d, which are disposed on the first interlayered insulating layer 238 of the cell region CR, and the protruding portions 240b and 240c, which are disposed on the first interlayered insulating layer 238 of the peripheral circuit region PR. The bit lines 240d may extend parallel to the first direction X and may be spaced apart from each other along the second direction Y. Each of the bit lines 240d may be connected to a corresponding one of the protruding portions 240b and 240c. For example, odd-numbered ones of the bit lines 240d may be connected to the first protruding portions 240b, respectively, and even-numbered ones of the bit lines 240d may be connected to the second protruding portions 240c, respectively. Each of the bit lines 240d may be continuously connected to the corresponding one of the protruding portions 240b and 240c, thereby forming a single body. When measured in the second direction Y, each of the bit lines 240d may have the fourth width W4, as shown in FIG. 9A, and each of the protruding portions 240b and 240c may have the first or second width W1 or W2, as shown in FIG. 7A. The first and second widths W1 and W2 may be substantially the same, and the fourth width W4 may be less than the first and second widths W1 and W2.

Each of the bit lines 240d may be electrically connected to the second doped regions SD2, respectively, of the active region ACT through the first contacts 242 penetrating the first interlayered insulating layer 238. Each of the second capping patterns 250a may be locally formed on the top surface of a corresponding one of the conductive patterns 240p.

The side surfaces of the protruding portions 240b and 240c may be covered with the second interlayered insulating layer 239, and the first spacer 244 may be interposed between the protruding portions 240b and 240c and the second interlayered insulating layer 239. As shown in FIG. 5C, each of the protruding portions 240b and 240c may have the side surface S which is positioned adjacent to the corresponding one of the bit lines 240d and is not covered with the second interlayered insulating layer 239 and the first spacer 244.

The opposite end of each of the bit lines 240d may not be connected to any of the protruding portions 240b and 240c. The opposite end of each of the bit lines 240d may have a side surface which is spaced apart from the second interlayered insulating layer 239 by the first spacer 244 to face the second interlayered insulating layer 239.

The second spacers 246 may be formed to cover two opposite side surfaces of each bit line 240d. The second spacer 246 may include at least one first portion, which extends along the first direction X and covers the side surfaces of the bit lines 240d, and at least one second portion, which extends along the second direction Y and is in contact with the side surface S of the protruding portion 240b or 240c. The second portion of the second spacer 246 may further extend along the second direction Y and may be in contact with the first spacer 244 and the second interlayered insulating layer 239. The second spacer 246 may be in contact with the first spacer 244 at a boundary B therebetween.

When viewed in plan view, as shown in FIG. 5C, each of the protruding portions 240b and 240c may have the pointed portion PP (i.e., corner) positioned near the boundary B between the first and second spacers 244 and 246.

The third interlayered insulating layer 280 may be provided on the first interlayered insulating layer 238 and between the bit lines 240d. The second spacer 246 may be interposed between the side surfaces of the bit lines 240d and the third interlayered insulating layer 280 and between the second interlayered insulating layer 239 and the third interlayered insulating layer 280.

The buried contacts 282 may be provided in the cell region CR of the substrate 200. The buried contacts 282 may be connected to the first pads 235, respectively, through the first and third interlayered insulating layers 238 and 280. The memory elements may be provided on the third interlayered insulating layer 280 and may be connected to the buried contacts 282, respectively. In some embodiments, each memory element may be a capacitor including the lower electrode 286, the upper electrode 290, and the dielectric layer 288 between the lower and upper electrodes 286 and 290. The supporting layer 284 may be provided between the upper electrode 290 and the third interlayered insulating layer 280. The dielectric layer 288 may be laterally extended and may be between the supporting layer 284 and the upper electrode 290. The supporting layer 284 may be extended toward the peripheral circuit region PR to cover the second interlayered insulating layer 239.

The second contacts CT may penetrate the supporting layer 284 and the second capping pattern 250a and may be connected to the protruding portions 240b and 240c, respectively. When viewed in a sectional view, each of the second contacts CT may have the bottom surface L1 that is in contact with a corresponding one of the protruding portions 240b and 240c and is positioned at a higher level than the bottom surface L2 of the protruding portions 240b and 240c. The top area of each of the protruding portions 240b and 240c may be substantially equal to or greater than an area of the bottom surface L1 of each of the second contacts CT. Furthermore, the interconnection lines L may be provided on the supporting layer 284 of the peripheral circuit region PR.

The interconnection lines L may be connected to the second contacts CT and may be used as paths for delivering signals from or to the bit lines 240d.

FIGS. 11A through 16A are plan views illustrating a fine patterning method for semiconductor devices, according to some embodiments of the inventive concept, and FIGS. 11B through 16B are diagrams illustrating vertical sections taken along lines I-I', II-II', and III-III' of FIGS. 11A through 16A, respectively.

Figure 11A:
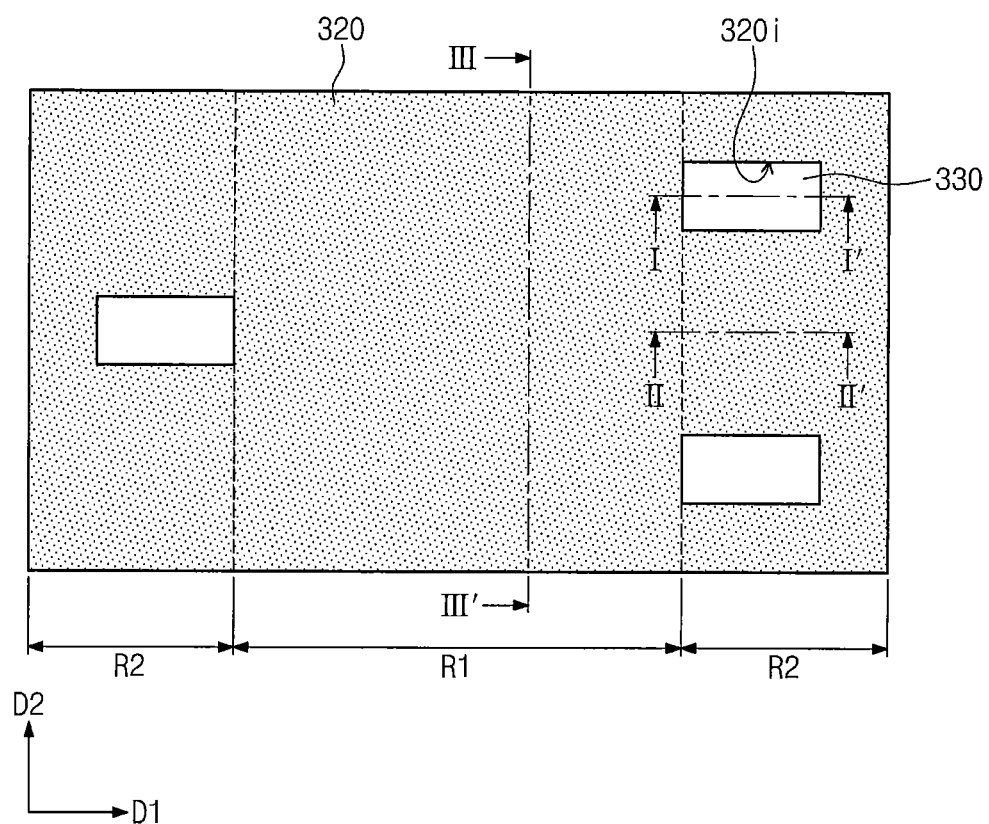
Figure 11B:
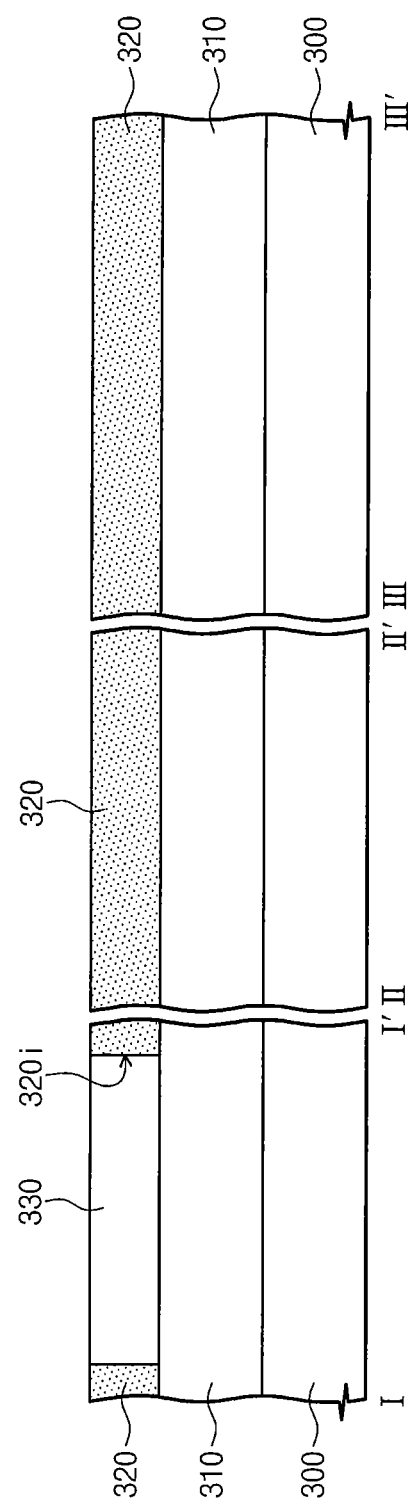

Referring to FIGS. 11A and 11B, a substrate 300 with a first region R1 and a second region R2 may be provided. The first region R1 may be a region of the substrate 300, and the second region R2 may be another region of the substrate 300 provided around or near the first region R1. In some embodiments, the substrate 300 may be a semiconductor substrate (e.g., a silicon, germanium, or silicon-germanium wafer). A mold layer 310 may be formed on the substrate 300. The mold layer 310 may be formed of or include at least one of an oxide layer, a nitride layer, an oxynitride layer or other materials.

A first sacrificial layer 320 may be formed on the mold layer 310. The first sacrificial layer 320 may be formed of or include an SOH layer. Thereafter, a plurality of insulating patterns 330 may be formed in the first sacrificial layer 320 of the second region R2. The insulating patterns 330 may be formed spaced apart from each other (for example, along the second direction D2) and may be staggered relative to one another. The insulating patterns 330 may be formed of or include a silicon oxide layer. The formation of the insulating patterns 330 may include patterning the first sacrificial layer 320 to form a plurality of grooves 320i, forming an insulating layer on the first sacrificial layer 320 to fill the grooves 320i, and planarizing the insulating layer to expose the first sacrificial layer 320. The insulating patterns 330 may be locally formed in the grooves 320i, respectively.

Figure 12A:
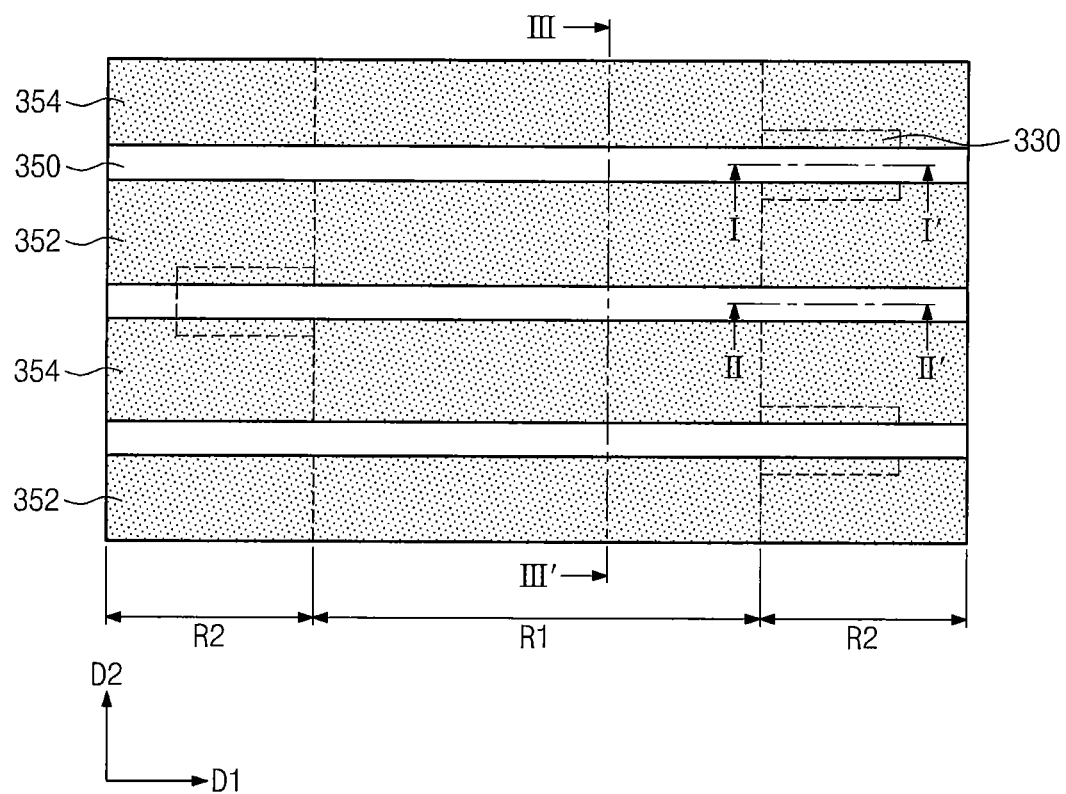
Figure 12B:
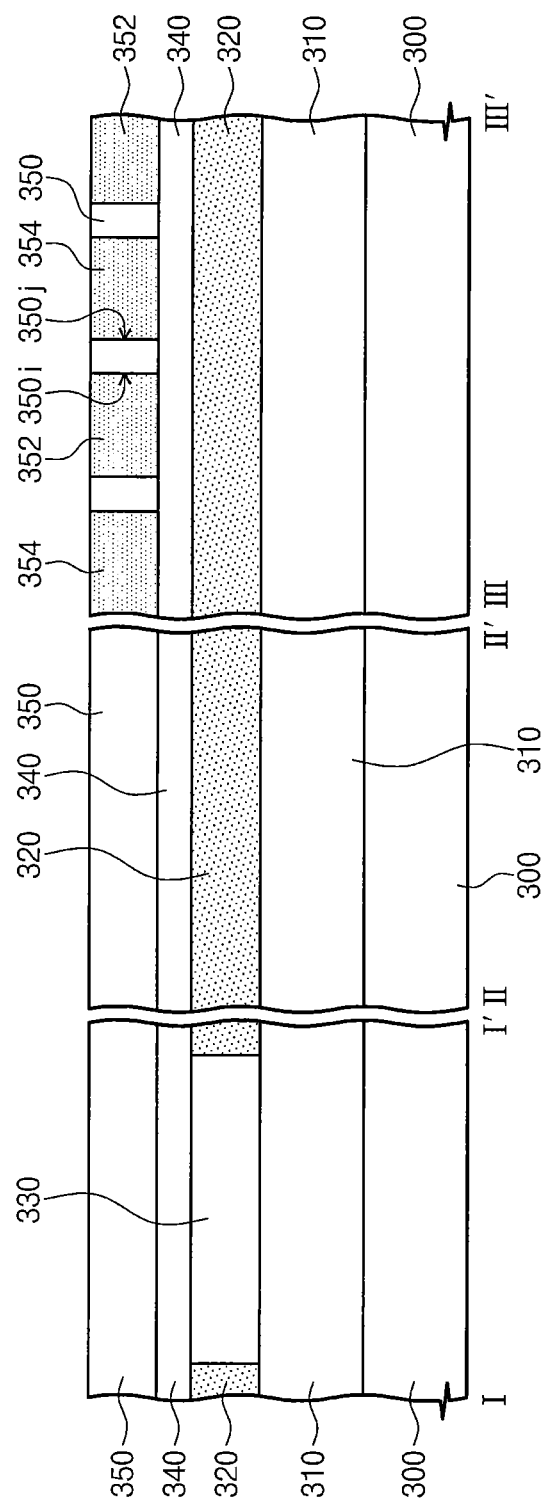

Referring to FIGS. 12A and 12B, an etch stop layer 340 may be formed on the first sacrificial layer 320. The etch stop layer 340 may be formed to cover top surfaces of the insulating patterns 330. The etch stop layer 340 may be formed of or include a silicon nitride layer or other materials.

First mask patterns 350 may be formed on the etch stop layer 340. The first mask patterns 350 may extend parallel to the first direction D1 and may be spaced apart from each other in the second direction D2. When viewed in plan view, each of the first mask patterns 350 may overlap a corresponding one of the insulating patterns 330 on the second region R2. The first mask patterns 350 may be formed of or include a silicon oxide layer or other materials.

The formation of the first mask patterns 350 may include forming second sacrificial patterns 352, which extend parallel to the first direction D1 and are spaced apart from each other in the second direction D2, on the etch stop layer 340, forming a mask layer to cover the second sacrificial patterns 352, and anisotropically etching the mask layer to expose top surfaces of the second sacrificial patterns 352 and expose the etch stop layer 340 between the second sacrificial patterns 352. The second sacrificial patterns 352 may be formed of or include an SOH layer or other material. As a result of the anisotropic etching process, the first mask patterns 350 may be locally formed on both side surfaces of each of the sacrificial patterns 352. For example, the first mask patterns 350 may have a spacer-shaped structure.

Each of the first mask patterns 350 may have a first side surface 350i in contact with the second sacrificial patterns 352 and a second side surface 350j opposite to the first side surface 350i. Third sacrificial patterns 354 may be formed to fill gap regions, respectively, which are formed between opposite ones of the second side surfaces 350j of the first mask patterns 350. The third sacrificial patterns 354 may extend along the first direction D1 and may be spaced apart from each other in the second direction D2. The first mask patterns 350, the second sacrificial patterns 352, and the third sacrificial patterns 354 may have top surfaces that are substantially coplanar with each other. The third sacrificial patterns 352 and 354 may be formed of or include an SOH layer or other materials.

Figure 13A:
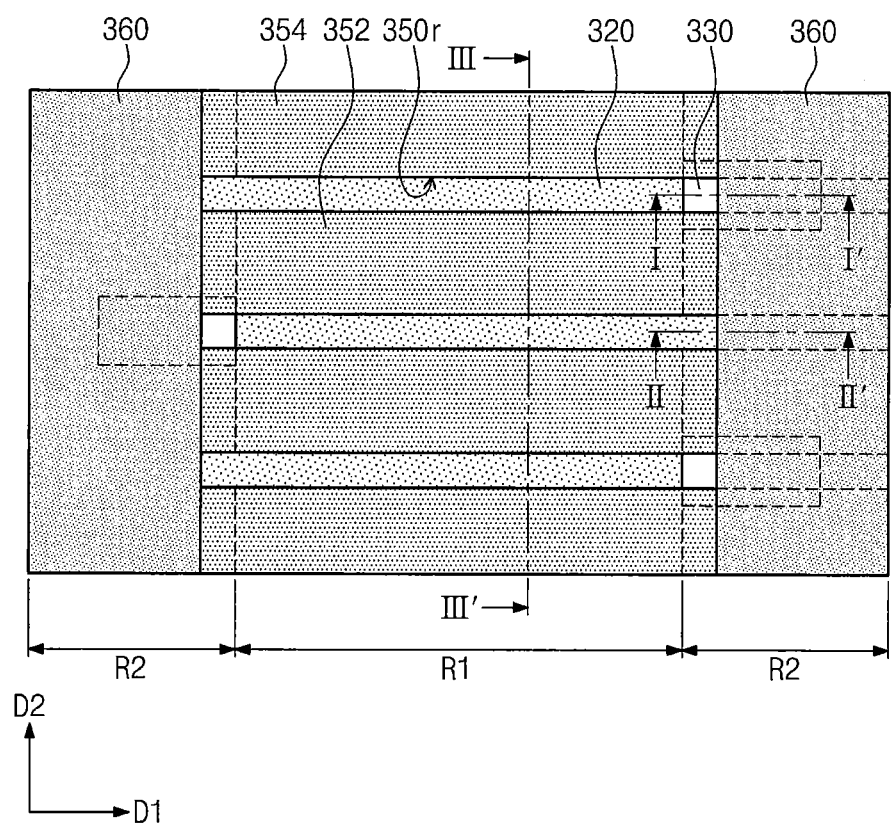
Figure 13B:
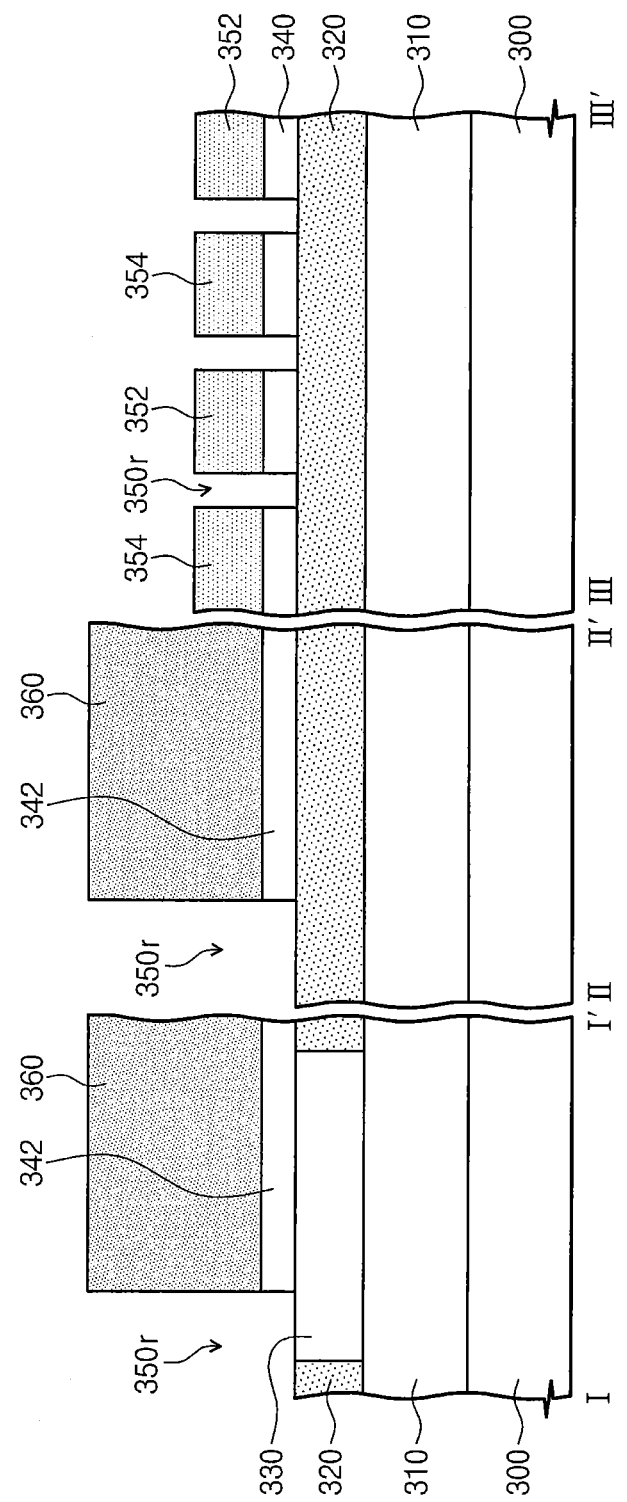

Referring to FIGS. 13A and 13B, the first mask patterns 350 may be removed to form gap regions 350r exposing the etch stop layer 340 between adjacent ones of the second and third sacrificial patterns 352 and 354. The gap regions 350r may extend along the first direction D1 and may be spaced apart from each other in the second direction D2. The first mask patterns 350 may be removed using, for example, a wet etching process.

After the formation of the gap regions 350r, a second mask pattern 360 may be formed on the etch stop layer 340 of the second region R2. The second mask pattern 360 may be formed to fill at least a portion of each of the gap regions 350r on the second region R2 and cover at least a portion of each of the insulating patterns 330. The second mask pattern 360 may be a photoresist pattern.

Thereafter, the etch stop layer 340 may be patterned using the second and third sacrificial patterns 352 and 354 and the second mask pattern 360 as an etch mask to form an etch stop pattern 342. The etch stop pattern 342 may be formed to have openings exposing the first sacrificial layer 320. For example, the etch stop layer 340 may be patterned using the second and third sacrificial patterns 352 and 354 as the etch mask to partially expose the first sacrificial layer 320 on the first region R1 and may be patterned using the second mask pattern 360 as the etch mask to partially expose the first sacrificial layer 320 and the insulating patterns 330 on the second region R2.

Figure 14A:
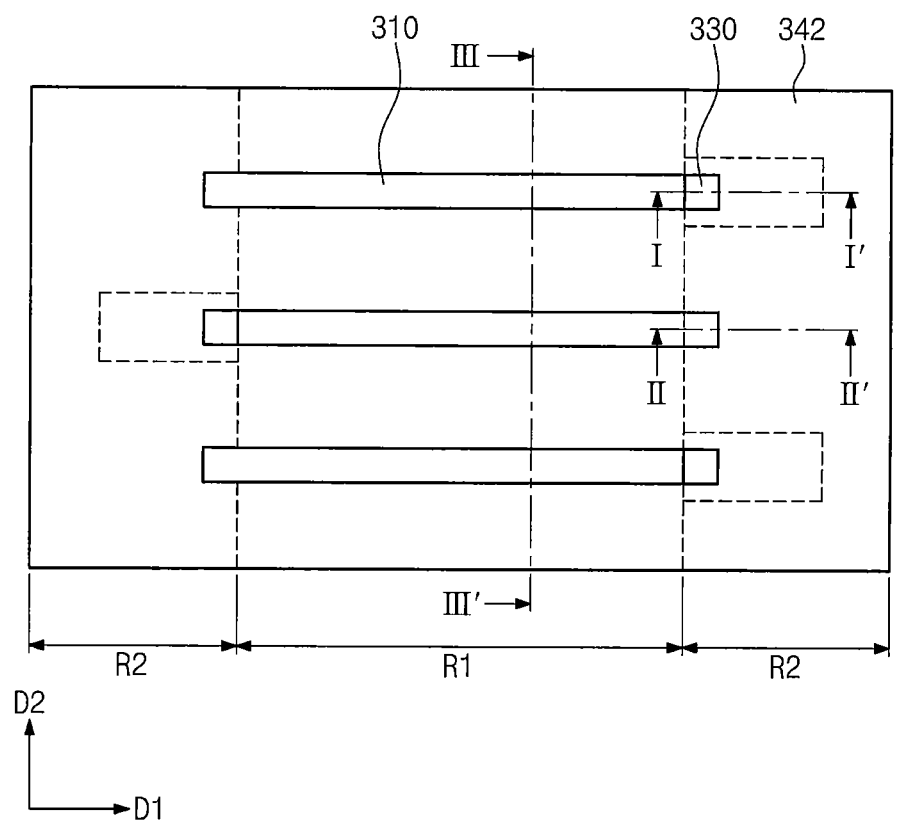
Figure 14B:
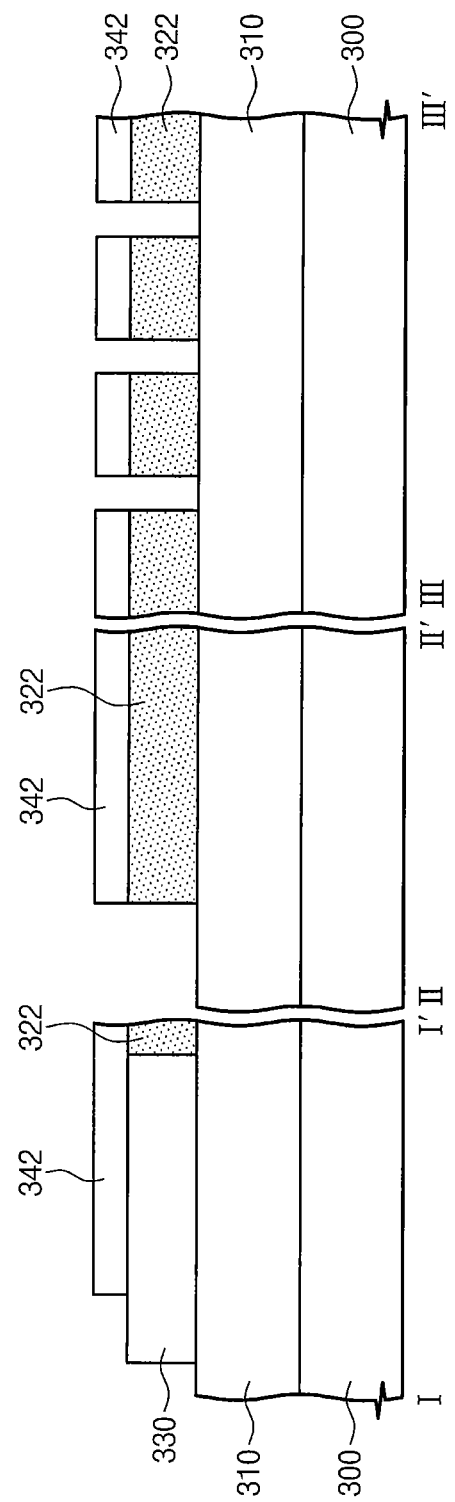

Referring to FIGS. 14A and 14B, the second and third sacrificial patterns 352 and 354 and the second mask pattern 360 may be removed. For example, the second and third sacrificial patterns 352 and 354 and the second mask pattern 360 may be removed using, for example, an ashing and/or strip process.

Thereafter, the first sacrificial layer 320 may be patterned using the etch stop pattern 342 as an etch mask to form a first sacrificial pattern 322 having openings exposing the mold layer 310. For example, the first sacrificial pattern 322 may be formed to partially expose the mold layer 310 on the first region R1 and partially expose the mold layer 310 and the insulating patterns 330 on the second region R2.

Figure 15A:
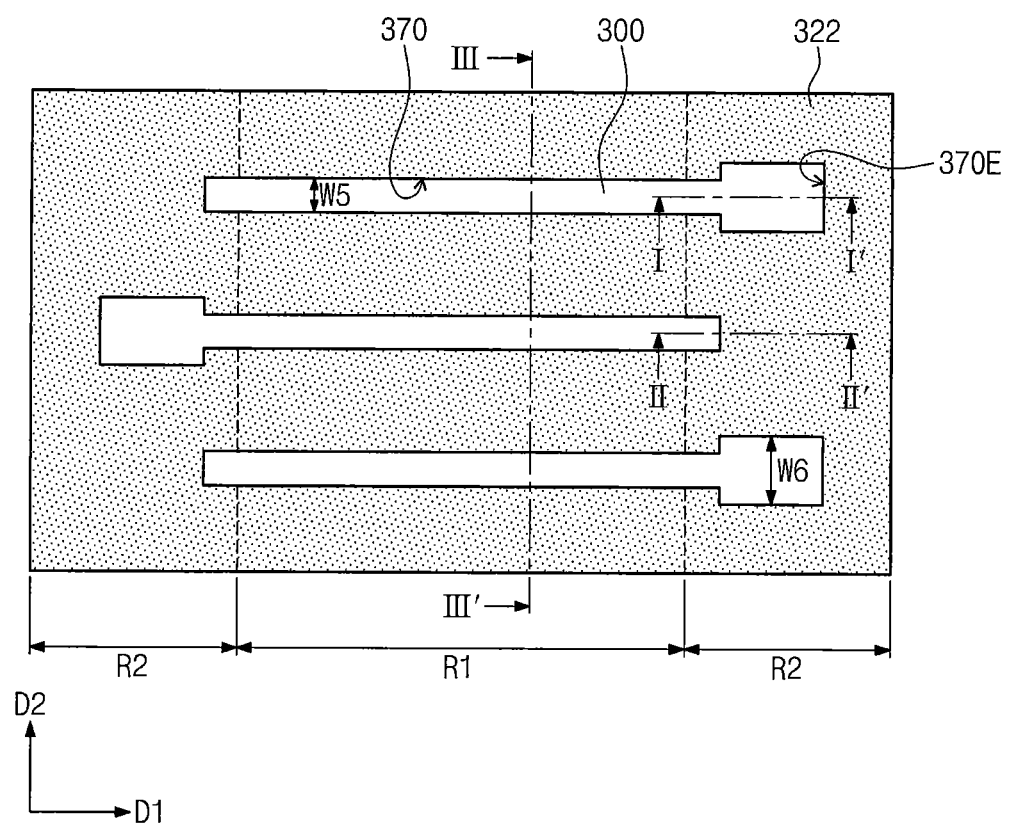
Figure 15B:
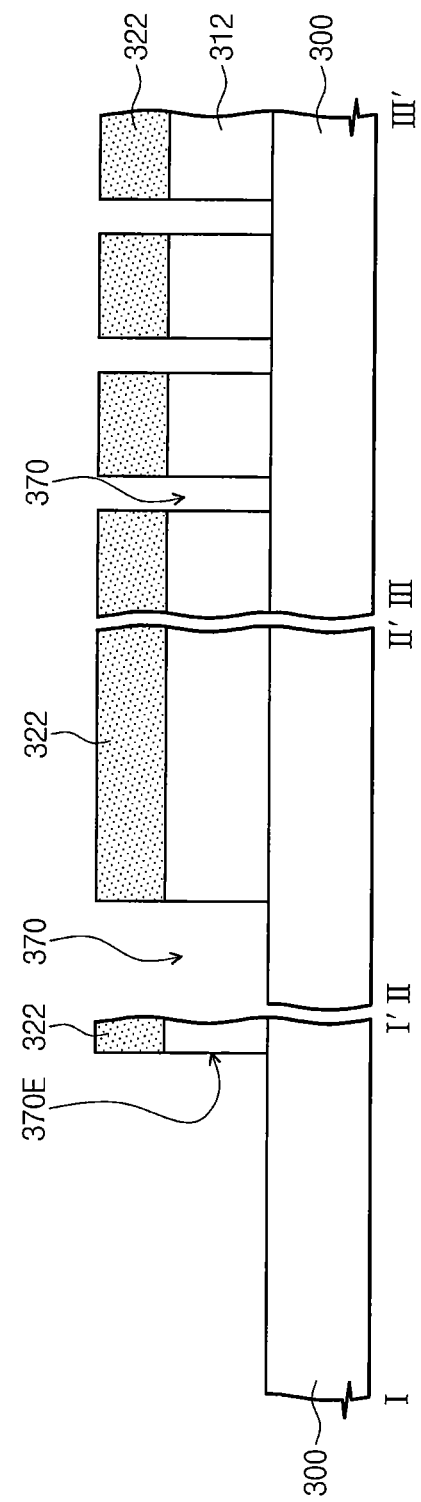

Referring to FIGS. 15A and 15B, the etch stop pattern 342 may be removed. The etch stop pattern 342 may be removed using, for example, a wet etching process. Thereafter, the mold layer 310 may be etched using the first sacrificial pattern 322 as an etch mask to form first grooves 370. The first grooves 370 may be formed in the mold layer 310 to partially expose the substrate 300. During the etching process, the insulating patterns 330 may also be removed, and thus, end portions 370E of the first grooves 370 may be formed in the mold layer 310 of the second region R2. Hereinafter, the mold layer 310 with the first grooves 370 will be referred to as a mold pattern 312.

The first grooves 370 may extend along the first direction D1 and may be spaced apart from each other in the second direction D2. Each of the first grooves 370 may extend to the second region R2. For example, the first grooves 370 may have the end portions 370E that are formed on the second region R2. When measured in the second direction D2, each of the first grooves 370 on the first region R1 may have a fifth width W5, and the end portion 370E may have a sixth width W6 on the second region R2. In some embodiments, the sixth width W6 may be greater than the fifth width W5.

Figure 16A:
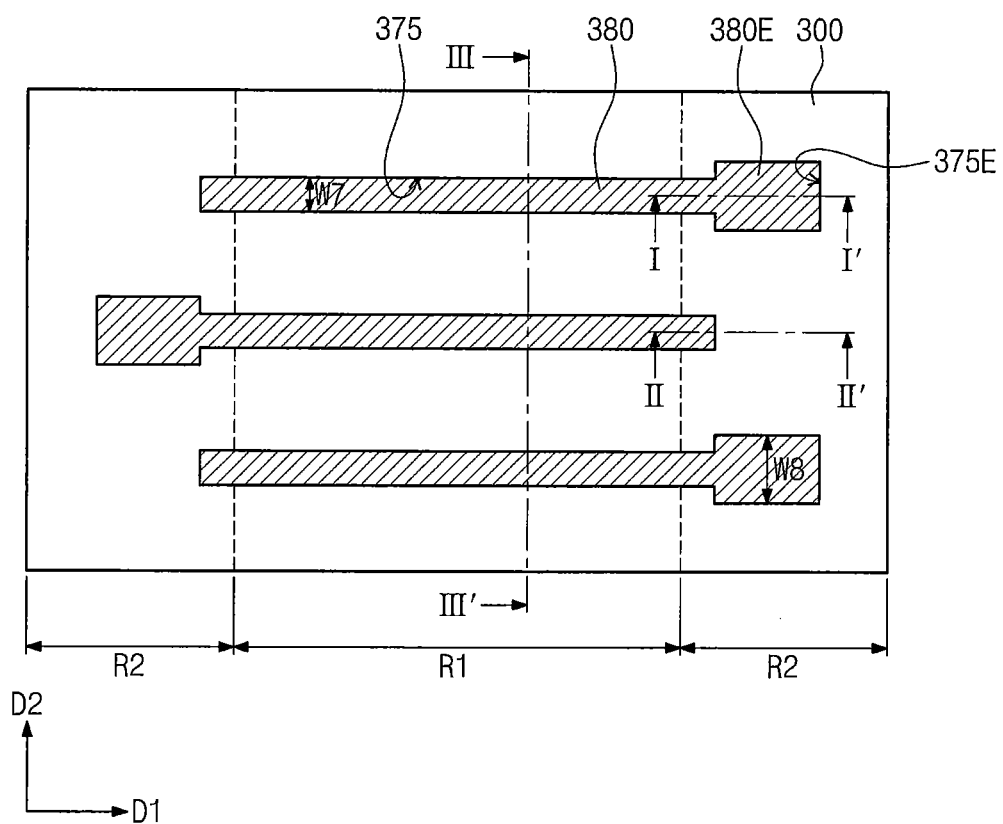
Figure 16B:
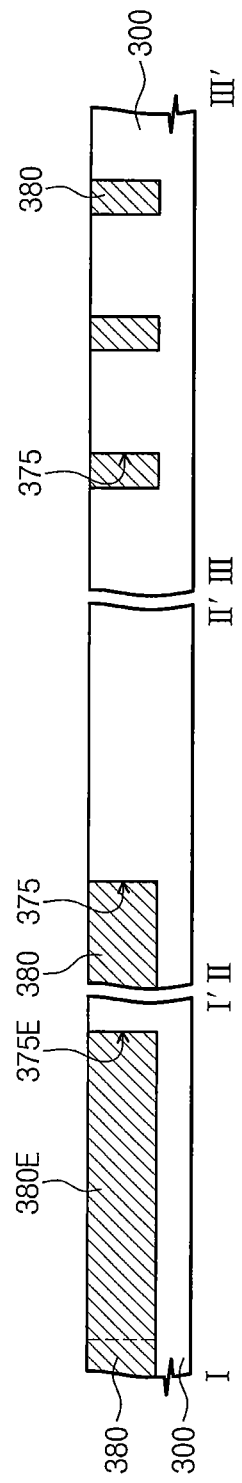

Referring to FIGS. 16A and 16B, the first sacrificial pattern 322 may be removed. For example, the first sacrificial pattern 322 may be removed using an ashing and/or strip process. Thereafter, the substrate 300 may be etched using the mold pattern 312 as an etch mask to form second grooves 375 in the substrate 300. The second grooves 375 may extend parallel to the first direction D1 and may be formed spaced apart from each other in the second direction D2. Each of the second grooves 375 may extend to the second region R2. For example, the second grooves 375 may have end portions 375E that are formed on the second region R2.

Conductive patterns 380 may be formed in the second grooves 375, respectively. The conductive patterns 380 may extend parallel to the first direction D1 and may be spaced apart from each other in the second direction D2. Each of the conductive patterns 380 may extend to the second region R2. For example, the conductive patterns 380 may have end portions 380E that are formed on the second region R2.

When measured in the second direction D2, each of the conductive patterns 380 on the first region R1 may have a seventh width W7, and the end portion 380E of each conductive pattern 380 may have an eighth width W8 on the second region R2. In some embodiments, the eighth width W8 may be greater than the seventh width W7.

Figure 17A:
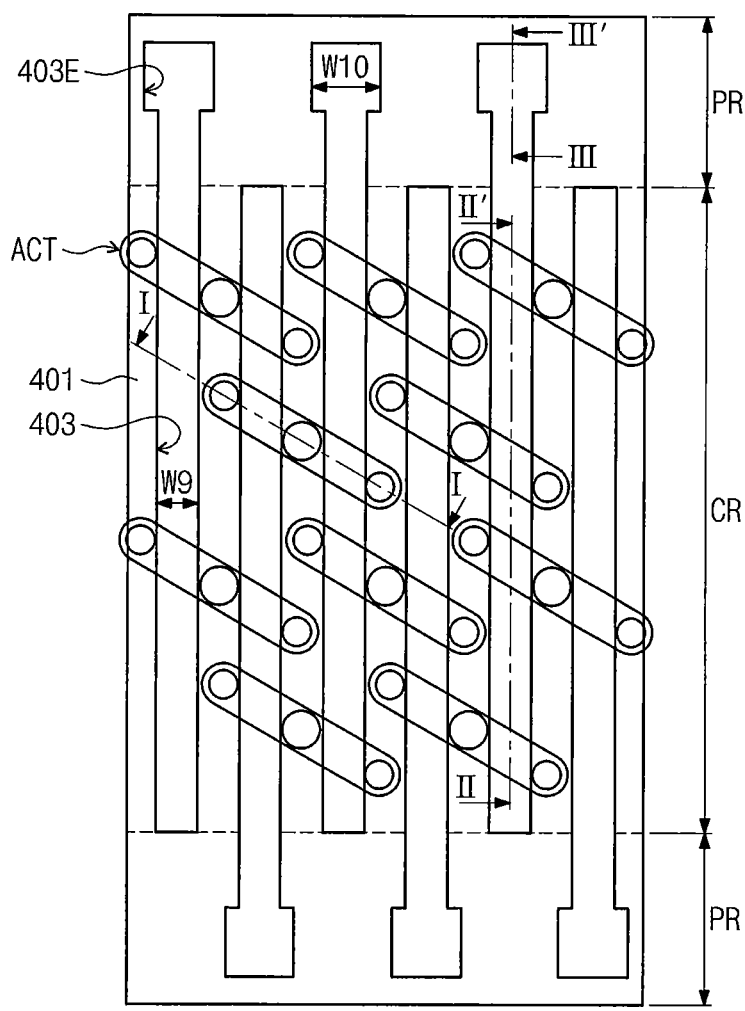
FIGS. 17A and 18A are plan views illustrating a method of fabricating semiconductor devices using the fine patterning method according to some embodiments of the inventive concept.
Figure 17B:
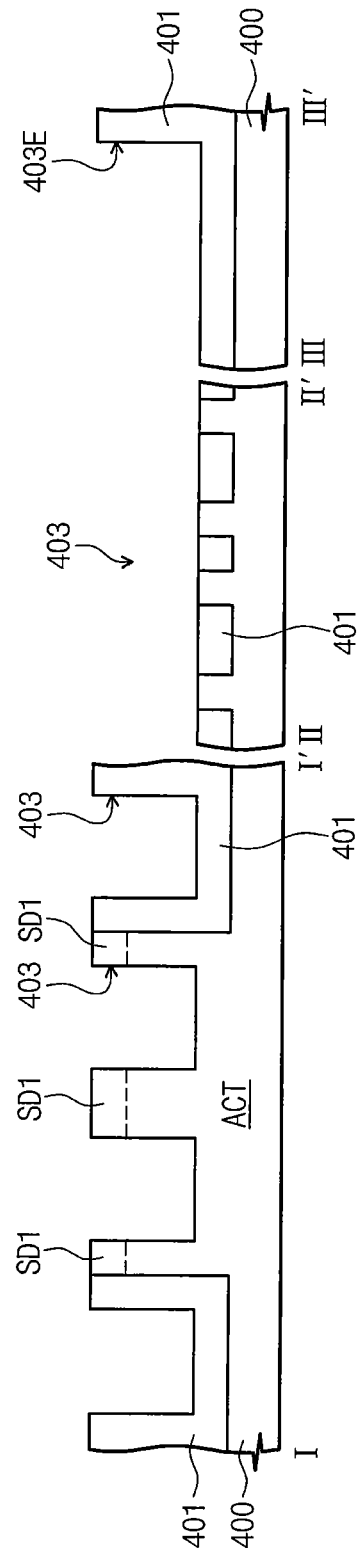
FIGS. 17B and 18B are diagrams illustrating vertical sections taken along lines I-I', II-II', and III-III' of FIGS. 17A and 18A, respectively.
Figure 18A:
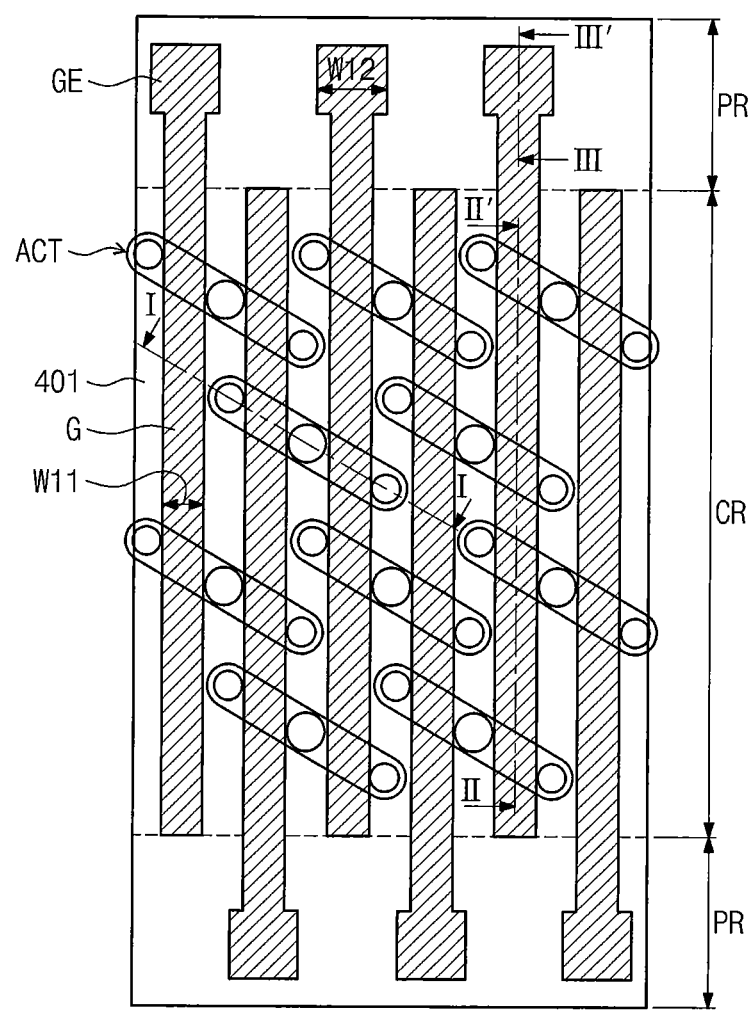
Figure 18B:
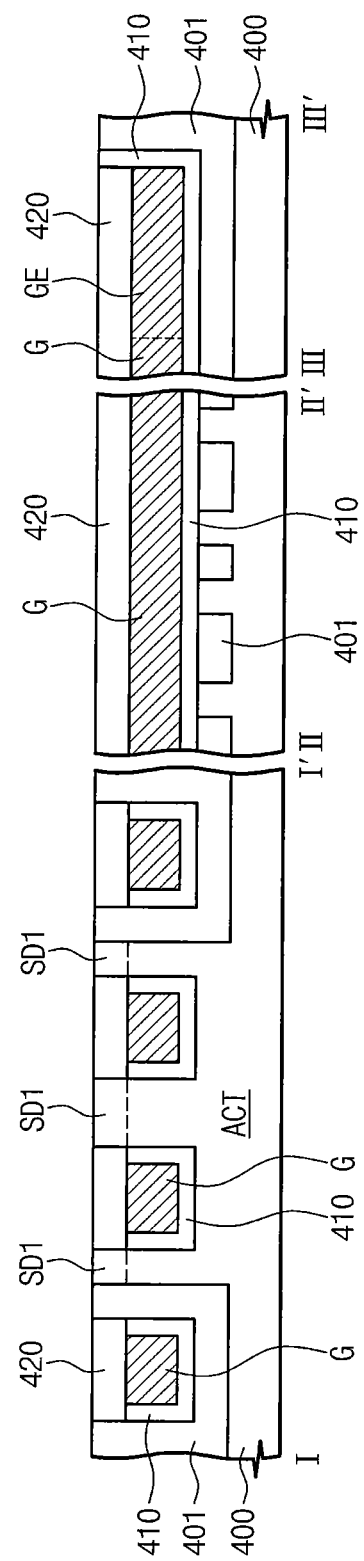

FIGS. 17A and 18A are plan views illustrating a method of fabricating a semiconductor device, using the fine patterning method according to some embodiments of the inventive concept, and FIGS. 17B and 18B are diagrams illustrating vertical sections taken along lines I-I', II-II', and III-III' of FIGS. 17A and 18A, respectively. For concise description, an element or step previously described may be identified by a similar or identical reference number without repeating an overlapping description thereof.

Referring to FIGS. 17A and 17B, a substrate 400 including the cell region CR and the peripheral circuit region PR may be provided. A device isolation layer 401 may be formed on the substrate 400 to define active regions ACT. When viewed in plan view, the active region ACT may be formed to have a bar shape and may be formed in such a way that a longitudinal axis thereof is parallel to a third or S direction. Here, the third or S direction is not parallel to any of a first and second (or X and Y) directions which are not parallel to (for example, orthogonal to) each other. First doped regions SD1 may be formed in the active regions ACT, respectively, of the substrate 400. The first doped regions SD1 may be formed by an ion implantation process.

In the cell region CR, the substrate 400 and the device isolation layer 401 may be etched to form a plurality of line-shaped grooves 403 extending parallel to the second direction Y. The grooves 403 may be formed on the cell region CR to be spaced apart from each other in the first direction X. Each of the grooves 403 may be extended into the peripheral circuit region PR. For example, the grooves 403 may have end portions 403E that are located on the peripheral circuit region PR. When measured along the first direction X, each of the grooves 403 may have a ninth width W9 on the cell region CR, and the end portion 403E may have a tenth width W10 on the peripheral circuit region PR. In some embodiments, the tenth width W10 may be greater than the ninth width W9. The grooves 403 may be formed using the fine patterning method described with reference to, for example, FIGS. 11A through 16A and FIGS. 11B through 16B.

Referring to FIGS. 18A and 18B, a gate insulating layer and a gate layer may be sequentially formed on the substrate 400 with the grooves 403. The gate insulating layer may be formed using a thermal oxidation process, an atomic layer deposition, or a chemical vapor deposition process. The insulating layer may be formed of or include, for example, a silicon oxide layer. The gate layer may be formed using, for example, a chemical vapor deposition process. The gate layer may be formed of or include a conductive material. The conductive material for the gate layer may be at least one of, for example, doped semiconductor materials (e.g., doped silicon, doped germanium, and so forth), conductive metal nitrides (e.g., titanium nitride, tantalum nitride, and so forth), metals (e.g., tungsten, titanium, tantalum, and so forth), and metal-semiconductor compounds (e.g., tungsten silicide, cobalt silicide, titanium silicide, and so forth).

Thereafter, the conductive layer may be etched to form gate lines G. The etching process may be performed until a thickness of the conductive layer in the grooves 403 reaches a desired value. An exposed portion of the insulating layer, which is not covered by the gate lines G, may be removed, and thus, gate insulating patterns 410 may be formed between the gate lines G and the active region ACT and/or between the gate lines G and the device isolation layer 401. The etching process may be performed to expose top surfaces of the device isolation layer 401 and the active region ACT.

Further, as the result of the etching process, gate line extended portions GE may be formed to fill the end portions 403E of the grooves 403. When measured along the first direction X, each of the gate lines G may have an eleventh width W11 on the cell region CR, each of the gate line extended portions GE may have a twelfth width W12 on the peripheral circuit region PR. In some embodiments, the twelfth width W12 may be greater than the eleventh width W11. In a subsequent process, contacts for applying voltages to the gate lines G may be formed on the gate line extended portions GE. According to some embodiments of the inventive concept, since the gate line extended portions GE are formed to be wider than the gate lines G on the cell region CR, it is possible to fabricate a semiconductor device with a reduced contact resistance.

After the etching process, capping patterns 420 may be formed in the grooves 403, respectively. The capping patterns 420 may be formed of or include at least one of a silicon nitride layer, a silicon oxide layer, and/or a silicon oxynitride layer. The formation of the capping patterns 420 may include forming a capping layer on the substrate 400 and planarizing the capping layer to expose the substrate 400.

The subsequent processes may be performed using those of the fine patterning method described with reference to, for example, FIGS. 6A through 10A and FIGS. 6B through 10B.

According to some embodiments of the inventive concept, it is possible to form an interconnection pattern including a fine line pattern and a contact pad that are continuously connected to form a single body. Here, the contact pad is formed to have a width that is greater than that of the line pattern which is part of the single body. This makes it possible to improve a contact resistance of a semiconductor device.

Figure 19:
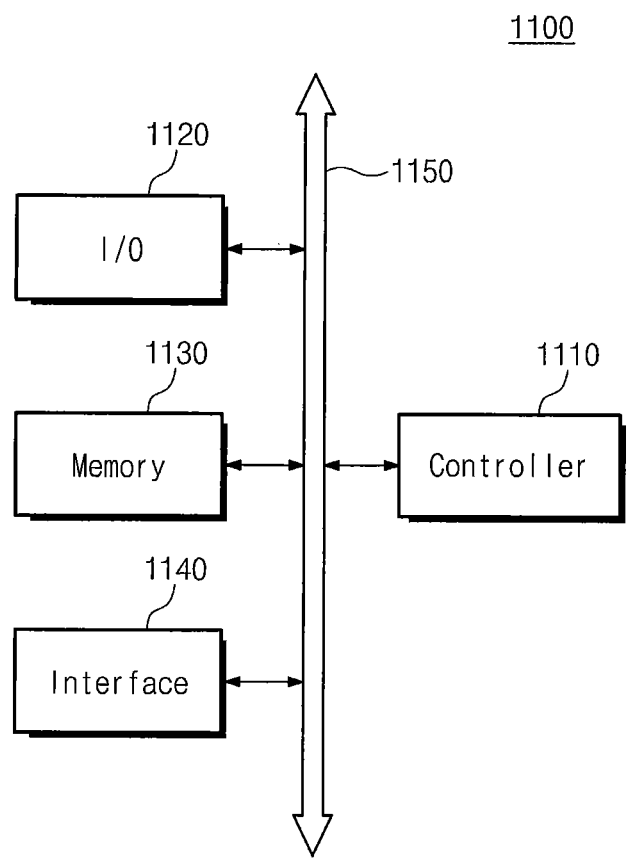
FIG. 19 is a block diagram illustrating an example of electronic systems including a semiconductor device according to some embodiments of the inventive concept.

FIG. 19 is a block diagram illustrating an example of electronic systems including a semiconductor device according to some embodiments of the inventive concept.

Referring to FIG. 19, an electronic system 1100 according to some embodiments of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard or a display unit. The memory device 1130 may store data and/or commands. The memory device 1130 may include one or more semiconductor devices according to some embodiments of the inventive concept. In other embodiments, the memory device 1130 may further include a semiconductor memory device, which is different from the semiconductor memory devices according to embodiments of the inventive concept. The interface unit 1140 may transmit electrical data to a communication network or may receive electrical data from a communication network.

The electronic system 1100 may be applied to a laptop computer, a personal digital assistant (PDA), a portable computer, a web tablet, a wireless phone, a mobile phone, a digital music player, a memory card or an electronic product.

Figure 20:
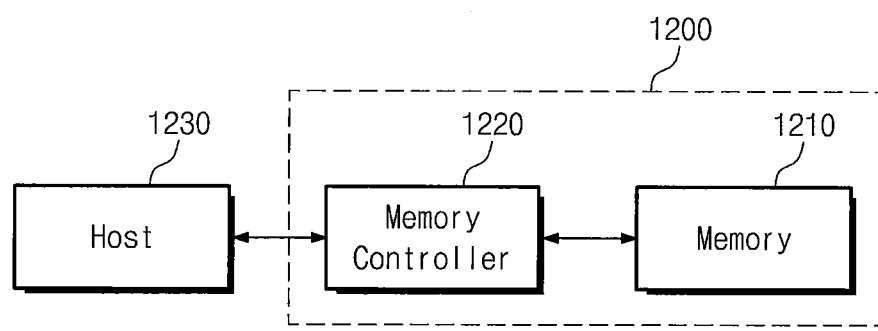
FIG. 20 is a block diagram illustrating an example of memory cards including the semiconductor memory devices according to some embodiments of the inventive concept.

FIG. 20 is a block diagram illustrating an example of memory cards including the semiconductor memory devices according to some embodiments of the inventive concept.

Referring to FIG. 20, a memory card 1200 according to some embodiments of the inventive concept may include a memory device 1210. The memory device 1210 may include at least one of the semiconductor memory devices according to embodiments of the inventive concept. In other embodiments, the memory device 1210 may further include a semiconductor memory device, which is different from the semiconductor memory devices according to embodiments of the inventive concept. The memory card 1200 may include a memory controller 1220 that controls data communication between a host 1230 and the memory device 1210.

According to some embodiments of the inventive concept, it is possible to form an interconnection pattern including a fine line pattern and a contact pad as a single body so that the first line and the contact pad are continuously connected to one another. Here, the contact pad may be formed to have a width that is greater than that of the line pattern, to reduce contact resistance.

While some embodiments of the inventive concepts have been particularly shown and described, it will be understood by one of ordinary skill in the art that variations in form and detail may be made therein without departing from the spirit and scope of the attached claims.

What is claimed:

1. A semiconductor device, comprising:
a line pattern in a cell region of a substrate extending along a first direction;
a contact pad in a peripheral region of the substrate that is connected to an end portion of the line pattern to form a single body with the line pattern,
wherein the end portion of the line pattern is a portion of the line pattern beyond which the line pattern does not extend;
a first spacer extending along a side surface of the contact pad; and
a second spacer, separate from the first spacer, extending in the first direction along a side surface of the line pattern and extending in a second direction, that crosses the first direction, along at least one portion of the side surface of the contact pad,
wherein the first and second spacers are in contact with each other to form a discontinuous boundary therebetween,
wherein the cell region is a region of the substrate on which memory cells are located, and
wherein the peripheral region of the circuit is a region of the substrate separate from the cell region on which peripheral circuits are provided.

2. The device of claim 1, wherein the line pattern has a first width in the second direction,
the contact pad has a second width in the second direction, and
the second width is greater than the first width.

3. The device of claim 1, wherein, when viewed in plan view, the contact pad has a pointed portion at a region where the first and second spacers are in contact with each other.

4. The device of claim 1, further comprising a contact in contact with the contact pad,
wherein the contact has a bottom surface that is positioned at a higher level than a bottom surface of the contact pad.

5. The device of claim 1, further comprising a word line on the substrate extending along the second direction, wherein the line pattern comprises a bit line.

6. The device of claim 1, wherein the line pattern comprises a plurality of line patterns that are arranged along the second direction, and
the contact pad comprises:
a plurality of first contact pads connected to odd-numbered ones of the line patterns, respectively; and
a plurality of second contact pads connected to even-numbered ones of the line patterns, respectively,
wherein, when viewed in the plan view, the first contact pads and the second contact pads face each other with the line patterns interposed therebetween in the first direction.

7. The device of claim 1, wherein the first spacer contacts the side surface of the contact pad, and
the second spacer contacts the side surface of the line pattern.

8. The device of claim 1, further comprising a third spacer provided on a side surface of an end portion of the line pattern that is opposite to the contact pad, wherein the third spacer extends in the second direction and includes the same material as the first spacer.

9. The device of claim 1, wherein the line pattern is a first line pattern and the contact pad is a first contact pad, the device further comprising:
a second line pattern in the cell region separate from the first line pattern that extends opposite the first direction to the peripheral region,
wherein the second spacer extends in the second direction from the first line pattern to the second line pattern;
a second contact pad in the peripheral region connected to a second end portion of the second line pattern,
wherein the second contact pad is in a portion of the peripheral region that is opposite the cell region from the first contact pad, and wherein the second end portion of the second line pattern is a portion of the second line pattern beyond which the second line pattern does not extend; and a third spacer, separate from the second spacer, extending along a side surface of the second contact pad.

10. The device of claim 1, wherein the second spacer contacts the at least one portion of the side surface of the contact pad at a first segment of the second spacer, wherein the second spacer comprises a second segment that is located in the peripheral area and that does not contact the contact pad, and wherein the boundary between the first spacer and the second spacer is located between the first segment and the second segment of the second spacer in the second direction.

11. A semiconductor device comprising:

a unitary interconnection pattern including a linear portion in a cell region of a substrate that extends in a first direction to a peripheral region of the substrate and including a contact portion in the peripheral region, wherein the contact portion of the unitary interconnection pattern is at an end portion of the unitary interconnection pattern beyond which the unitary interconnection pattern does not extend;

a first spacer on side walls of the linear portion; and a second spacer, that is separate from the first spacer, the second spacer on a side wall of the contact portion, wherein the first spacer comprises a first portion that extends in the first direction and a second portion that extends in a second direction that crosses the first direction, wherein the second spacer contacts the first spacer at a side wall of the second portion of the first spacer, wherein the cell region is a region of the substrate on which memory cells are located, and wherein the peripheral region of the circuit is a region of the substrate separate from the cell region on which peripheral circuits are provided.

12. The semiconductor device of claim 11 wherein the first spacer is on a portion of the side wall of the contact portion that faces the cell region and is absent from other side walls of the contact portion.

13. The semiconductor device of claim 12 wherein the second spacer is absent from the side wall of the contact portion that faces the cell region.

14. The semiconductor device of claim 11 wherein the contact portion is wider in the second direction than the linear portion.

15. The semiconductor device of claim 11 wherein the linear portion and the contact portion are commonly formed to provide the unitary interconnection pattern.

16. The semiconductor device of claim 13 wherein the first and second spacers meet at a discontinuous boundary aligned to the side wall of the contact portion that faces the cell region.

17. The semiconductor device of claim 11 wherein the unitary interconnection pattern comprises a first unitary interconnection pattern, the semiconductor device further comprising:

a second unitary interconnection pattern including a second linear portion in the cell region that extends opposite the first direction to the peripheral region and including a second contact portion in the peripheral region opposite the contact portion of the first unitary interconnection pattern.

18. The semiconductor device of claim 17 further comprising:

a third spacer on side walls of the second linear portion of the second unitary interconnection pattern; and a fourth spacer on the second unitary interconnection pattern, that is separate from the third spacer on the second unitary interconnection pattern, the fourth spacer on the second unitary interconnection pattern on a side wall of the second contact portion of the second unitary interconnection pattern.

19. The semiconductor device of claim 11 wherein the unitary interconnection pattern transitions from the linear portion to the contact portion in the peripheral region.

20. The semiconductor device of claim 17 wherein the first spacer extends in the first direction on side walls of the second linear portion of the second unitary interconnection pattern, wherein the first spacer extends in the second direction from the first unitary interconnection pattern to the second unitary interconnection pattern, and wherein the semiconductor device further comprises a third spacer on the second unitary interconnection pattern that is separate from the first spacer on the second unitary interconnection pattern and that extends on a side wall of the second contact portion of the second unitary interconnection pattern.

* * * * *